United States Patent
Nakui et al.

(10) Patent No.: US 10,754,209 B2
(45) Date of Patent: Aug. 25, 2020

(54) DISPLAY DEVICE AND INSPECTION METHOD OF DISPLAY DEVICE

(71) Applicant: SHARP KABUSHIKI KAISHA, Sakai, Osaka (JP)

(72) Inventors: Masanao Nakui, Sakai (JP); Shinji Sadamitsu, Sakai (JP); Masahisa Sakamoto, Sakai (JP)

(73) Assignee: SHARP KABUSHIKI KAISHA, Sakai, Osaka (JP)

( * ) Notice: Subject to any disclaimer, the term of this patent is extended or adjusted under 35 U.S.C. 154(b) by 40 days.

(21) Appl. No.: 16/081,196

(22) PCT Filed: Feb. 27, 2017

(86) PCT No.: PCT/JP2017/007300
§ 371 (c)(1),
(2) Date: Aug. 30, 2018

(87) PCT Pub. No.: WO2017/150403
PCT Pub. Date: Sep. 8, 2017

(65) Prior Publication Data
US 2019/0064562 A1    Feb. 28, 2019

(30) Foreign Application Priority Data

Mar. 1, 2016 (JP) .................... 2016-038700

(51) Int. Cl.
*G02F 1/1345* (2006.01)
*G02F 1/1362* (2006.01)
(Continued)

(52) U.S. Cl.
CPC .......... *G02F 1/1345* (2013.01); *G01R 27/02* (2013.01); *G02F 1/1309* (2013.01);
(Continued)

(58) Field of Classification Search
CPC .. G02F 1/1345; G02F 1/13452; G02F 1/1309; G02F 1/136286; G02F 2202/22;
(Continued)

(56) References Cited

U.S. PATENT DOCUMENTS 9,235,073 B2    1/2016  Hosoki
2007/0080905 A1*  4/2007  Takahara ............. G09G 3/3233
                                                            345/76

(Continued)

FOREIGN PATENT DOCUMENTS

JP    S59-099267 A    6/1984
JP    2008-158393 A   7/2008
(Continued)

*Primary Examiner* — Christopher P McAndrew
*Assistant Examiner* — Zannatul Ferdous
(74) *Attorney, Agent, or Firm* — ScienBiziP, P.C.

(57) ABSTRACT

A liquid crystal display device 10 includes a liquid crystal panel 11 including a CF substrate 11a having a display surface 11DS and an array substrate 11b disposed over a surface of the CF substrate 11a opposite the display surface 11DS, a control circuit board 12 connected to the array substrate 11b, a conductive layer 19 on the display surface 11DS of the CF substrate 11a, a plurality of conductive members 20 each having a first end connected to the conductive layer 19, a plurality of connection wiring lines 21 having first ends connected to respective second ends of the plurality of conductive members 20, a ground 12a connected to a second end of at least one of the plurality of connection wiring lines 21, and a plurality of inspection terminals 22 connected to the second ends of the plurality of connection wiring lines 21.

16 Claims, 13 Drawing Sheets

(51) Int. Cl.

| | | |
|---|---|---|
| *H05K 1/14* | (2006.01) | |
| *G02F 1/13* | (2006.01) | |
| *G01R 27/02* | (2006.01) | |
| *G09G 3/00* | (2006.01) | |
| *G09F 9/00* | (2006.01) | |
| *G09F 9/30* | (2006.01) | |
| *H05K 1/02* | (2006.01) | |
| *G02F 1/1343* | (2006.01) | |
| *G02F 1/1335* | (2006.01) | |
| *G02F 1/1368* | (2006.01) | |

(52) U.S. Cl.
CPC .... *G02F 1/13452* (2013.01); *G02F 1/136286* (2013.01); *G09F 9/00* (2013.01); *G09F 9/30* (2013.01); *H05K 1/0268* (2013.01); *G02F 1/1368* (2013.01); *G02F 1/133512* (2013.01); *G02F 1/136227* (2013.01); *G02F 2001/134372* (2013.01); *G02F 2201/52* (2013.01); *G02F 2202/22* (2013.01); *G09G 3/006* (2013.01); *H05K 1/147* (2013.01); *H05K 2201/056* (2013.01); *H05K 2201/093* (2013.01); *H05K 2201/10136* (2013.01); *H05K 2203/162* (2013.01)

(58) Field of Classification Search
CPC ... G02F 2001/134372; G02F 1/133512; G02F 1/136227; G02F 1/1368; G02F 2201/52; G09F 9/00; G09F 9/30; H05K 1/0268; H05K 2203/162; H05K 1/147; H05K 2201/056; H05K 2201/093; H05K 2201/10136; G01R 27/02

See application file for complete search history.

(56) References Cited

U.S. PATENT DOCUMENTS

| | | | |
|---|---|---|---|
| 2008/0048708 A1* | 2/2008 | Hsu | G09G 3/006 324/754.03 |
| 2008/0151167 A1 | 6/2008 | Aota et al. | |
| 2010/0085326 A1* | 4/2010 | Anno | G06F 3/044 345/174 |
| 2010/0182524 A1 | 7/2010 | Nomura | |
| 2014/0111498 A1* | 4/2014 | Kim | G09G 3/3291 345/212 |
| 2014/0340605 A1* | 11/2014 | Takeda | G02F 1/134363 349/43 |
| 2015/0002751 A1* | 1/2015 | Hosoki | G02F 1/133308 348/794 |

FOREIGN PATENT DOCUMENTS

| | | |
|---|---|---|
| JP | 2009-020272 A | 1/2009 |
| JP | 2010-164800 A | 7/2010 |
| JP | 2012-054211 A | 3/2012 |
| JP | 2014-224840 A | 12/2014 |
| JP | 2015-084001 A | 4/2015 |

* cited by examiner

DISPLAY DEVICE AND INSPECTION METHOD OF DISPLAY DEVICE

TECHNICAL FIELD

The present invention relates to a display device and an inspection method of a display device.

BACKGROUND ART

A liquid crystal display device disclosed in Patent Document 1 has been known as one type of a liquid crystal display device. The liquid crystal display device in Patent Document 1 has a transparent conductive resin portion on a counter substrate and a GMD connection electrode portion on an electrode pad portion. The GND connection electrode portion is electrically connected to the transparent conductive resin portion and a GND connection wiring line. Charges on the surface of the liquid crystal panel escape to a ground of a set-side printed circuit board through the transparent conductive resin portion, the GND connection electrode portion, an electrode connection wiring line, and an FPC-side GND connection wiring line.

RELATED ART DOCUMENT

Patent Document

Patent Document 1: Japanese Unexamined Patent Application Publication No. 2010-164800

Problem to be Solved by the Invention

The liquid crystal display device disclosed in Patent Document 1 may be inspected for proper connection between the transparent conductive resin portion and the ground of the set-side printed circuit board. In the inspection, a resistance between the transparent conductive resin portion and the ground of the set-side printed circuit board may be measured. However, the surface of the liquid crystal panel may be covered by a frame-shaped bezel, for example, in the production process of the liquid crystal display device. In such a case, an inspection device is not able to be in direct contact with the transparent conductive resin portion and the inspection is impossible.

Disclosure of the Present Invention

The present invention was made based on the above-described circumstances and an object thereof is to improve timing flexibility of the inspection.

Means for Solving the Problem

A display device according to the invention includes a display panel configured to display an image and including a first substrate having a display surface and a second substrate disposed over a surface of the first substrate opposite the display surface, a panel connection board connected to the second substrate, a conductive layer on the display surface of the first substrate, a plurality of conductive members each extending from the display surface of the first substrate to a surface of the second substrate adjacent to the first substrate and each having a first end connected to the conductive layer, a plurality of connection wiring lines extending from the second substrate to the panel connection board and having first ends connected to respective second ends of the plurality of conductive members, a ground disposed on the panel connection board and connected to a second end of at least one of the plurality of connection wiring lines, and a plurality of terminals disposed on the panel connection board and connected to the second ends of the plurality of connection wiring lines.

In this configuration, the conductive members, which extend from the display surface of the first substrate to the surface of the second substrate adjacent to the first substrate, are connected at the first ends to the conductive layer on the display surface of the first substrate, and at the second ends to the first ends of the connection wiring lines, which extend from the second substrate to the panel connection board. Since the ground is connected to the second end of at least one of the connection wiring lines, charges on the display surface of the first substrate escape to the ground. Thus, the charges are less likely to remain on the display surface. A resistance between the conductive layer and the ground may be measured to check if the conductive layer is properly connected to the ground through the conductive member and the connection wiring line. However, the conductive layer is covered by another component in some cases depending on the production steps. In such a case, direct contact with the conductive layer is impossible, making it difficult to measure the resistance. To overcome the problem, the terminals connected to the second ends of the connection wiring lines are disposed on the panel connection board. This enables the above-described inspection, when direct contact with the conductive layer is impossible, through measurement of the resistance between the terminals. This improves the timing flexibility of inspection.

The following configurations are preferred aspects of the display device according to the invention.

(1) The display device may further include a flexible board having flexibility and connecting the second substrate with the panel connection board. Since the flexible board having flexibility has high flexibility in shape, the panel connection board connected to the flexible board is positioned with a high degree of freedom. This configuration facilitates the inspection using the terminals on the panel connection board.

(2) The plurality of conductive members may be positioned with the flexible booed connected to the second substrate therebetween, with this configuration, the conductive members do not prevent connection between the second substrate and the flexible board.

(3) The flexible board may include a plurality of flexible boards. The plurality of flexible boards connected to the second substrate and the panel connection board may be disposed with a space therebetween. The number of the plurality of conductive members, the number of the plurality of connection wiring lines, and the number of the plurality of terminals may be each larger than the number of the flexible boards by one. In this configuration, since the conductive members outnumber the flexible boards by one, the flexible boards are disposed in respective spaces between the conductive members. The resistances between the terminals connected to the conductive members through the connection wiring lines are each measured for the inspection.

(4) One of the plurality of connection wiring lines may be routed on a different one of the plurality of flexible boards. In this configuration, the connection wiring lines are able to be routed on different flexible boards in accordance with the positions of the conductive members on the second substrate, for example. This configuration allows optimization of the routing of each of the connection wiring lines, leading to a reduction in the length of the wiring lines.

(5) The display device may further include a liquid crystal layer between the first substrate and the second substrate. With this configuration, charges are less likely to be accumulated on the display surface of the first substrate, leading to less alignment disorder of the liquid crystal molecules in the liquid crystal layer, which is located between the first substrate and the second substrate. Thus, high display quality is stably obtained.

Next, to solve the above-described problem, an inspection method of a display device according to the invention includes connecting an inspection source to any one of the plurality of terminals, connecting an inspection light source to another one of the plurality of terminals, and applying a voltage to the inspection source to determine if a resistance between the terminal connected to the inspection source and the terminal connected to the inspection light source exceeds a reference value. The inspection light source is configured to be switched on when a voltage equal to or larger than a threshold voltage is applied thereto. The voltage applied to the inspection light source is smaller than the threshold voltage when the resistance exceeds the reference value, and the voltage applied to the inspection light source is equal to or larger than the threshold voltage when the resistance is equal to or smaller than the reference value. In this inspection method of a display device, the light source that has not been switched on reveals that there is a bad connection at any one of the connections between the conductive layer, the conductive members, and the connection wiring lines. This facilitates the inspection.

The following is a preferred aspect of the inspection method of a display device according to the invention.

(1) A variable resistor may be connected in parallel with the inspection light source. A resistance of the variable resistor may be adjusted to change the reference value of the resistance. In this configuration, the resistance of the variable resistor is adjusted to change the reference value of the resistance between the terminals connected to the inspection source and the inspection light source. This enables the inspection proper for the reference value of the resistance, which is likely to change depending on the conditions such as a screen size of the display panel.

Advantageous Effect of the Invention

The present invention improves the timing flexibility of the inspection.

MODE FOR CARRYING OUT THE INVENTION

First Embodiment

Figure 6:
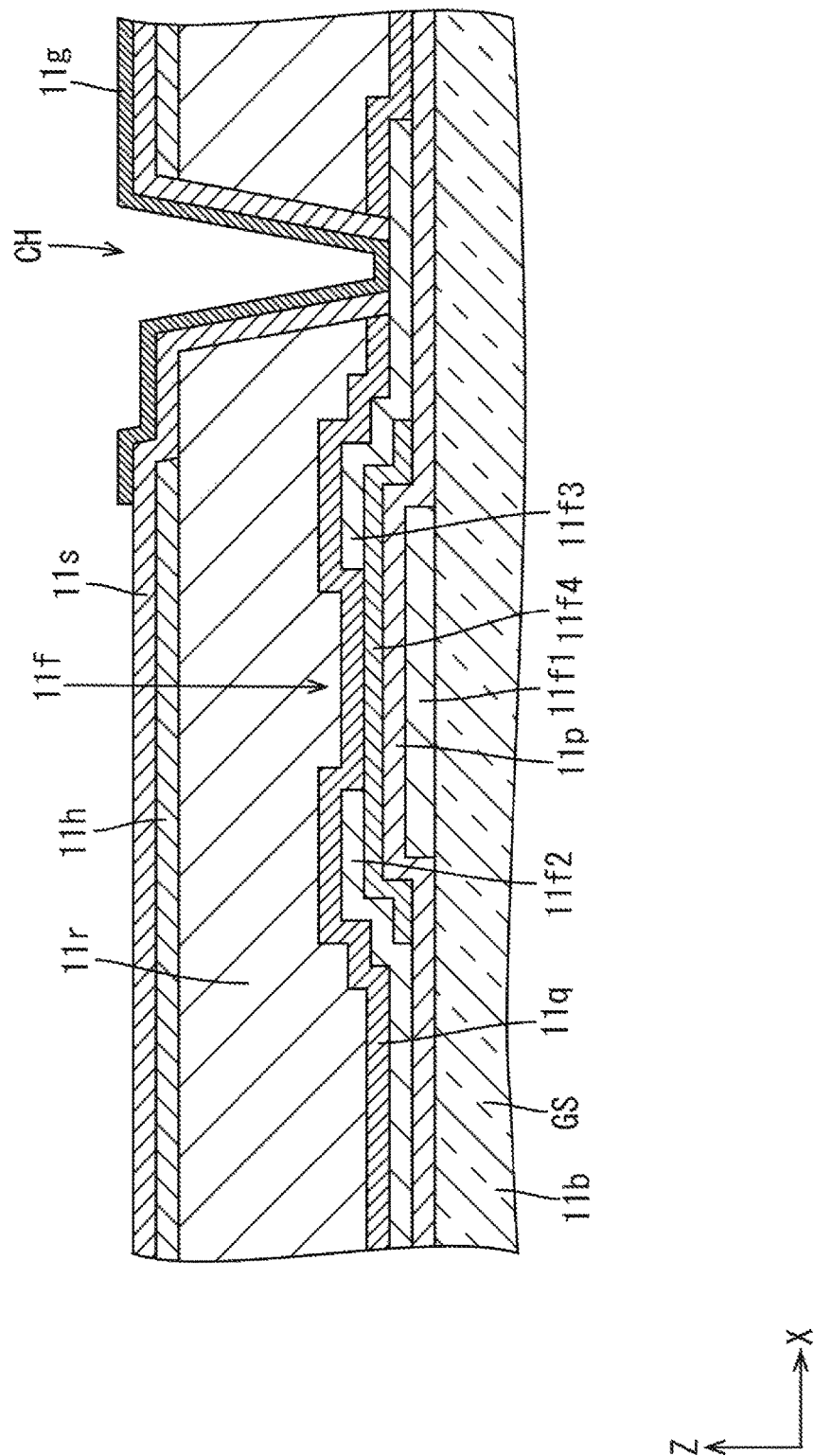
FIG. 6 is a cross-sectional view illustrating the array substrate taken along line A-A in FIG. 4.
Figure 7:
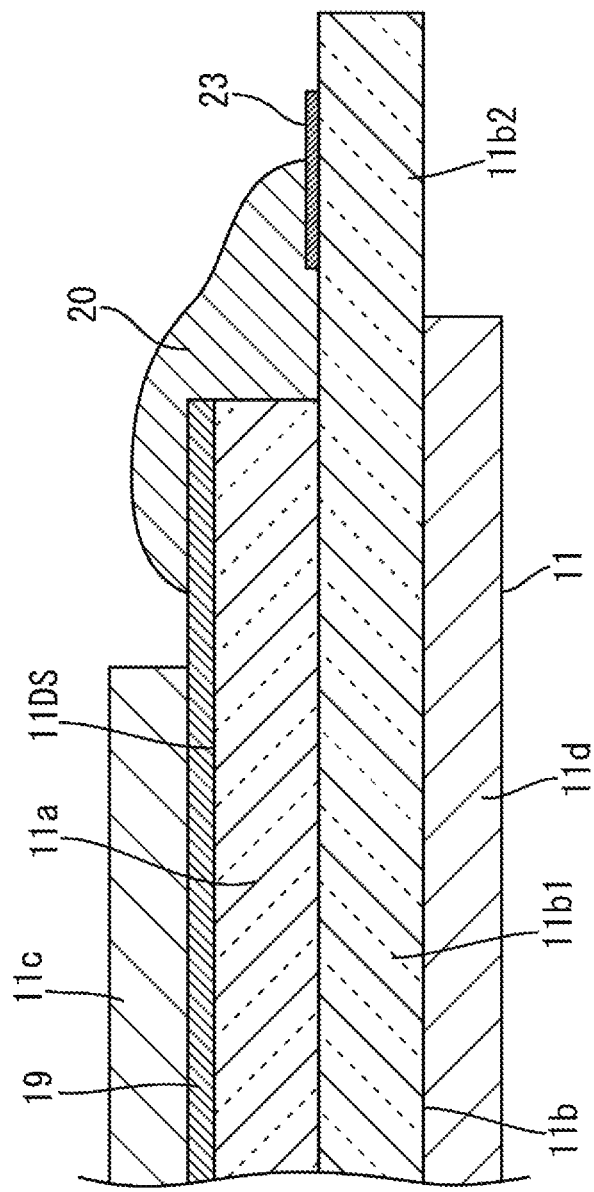
FIG. 7 is a cross-sectional view illustrating the liquid crystal panel taken along line B-B in FIG. 1.

A first embodiment of the present invention is described with reference to FIGS. 1 to 9. In this embodiment, a liquid crystal display device 10 is described as an example. The X axis, Y axis, and Z axis are indicated in some of the drawings, and each of the axes indicates the same direction in the respective drawings. The upper side in FIGS. 2 and 7 is a front side and the lower side in FIGS. 2 and 7 is a rear side.

Figure 1:
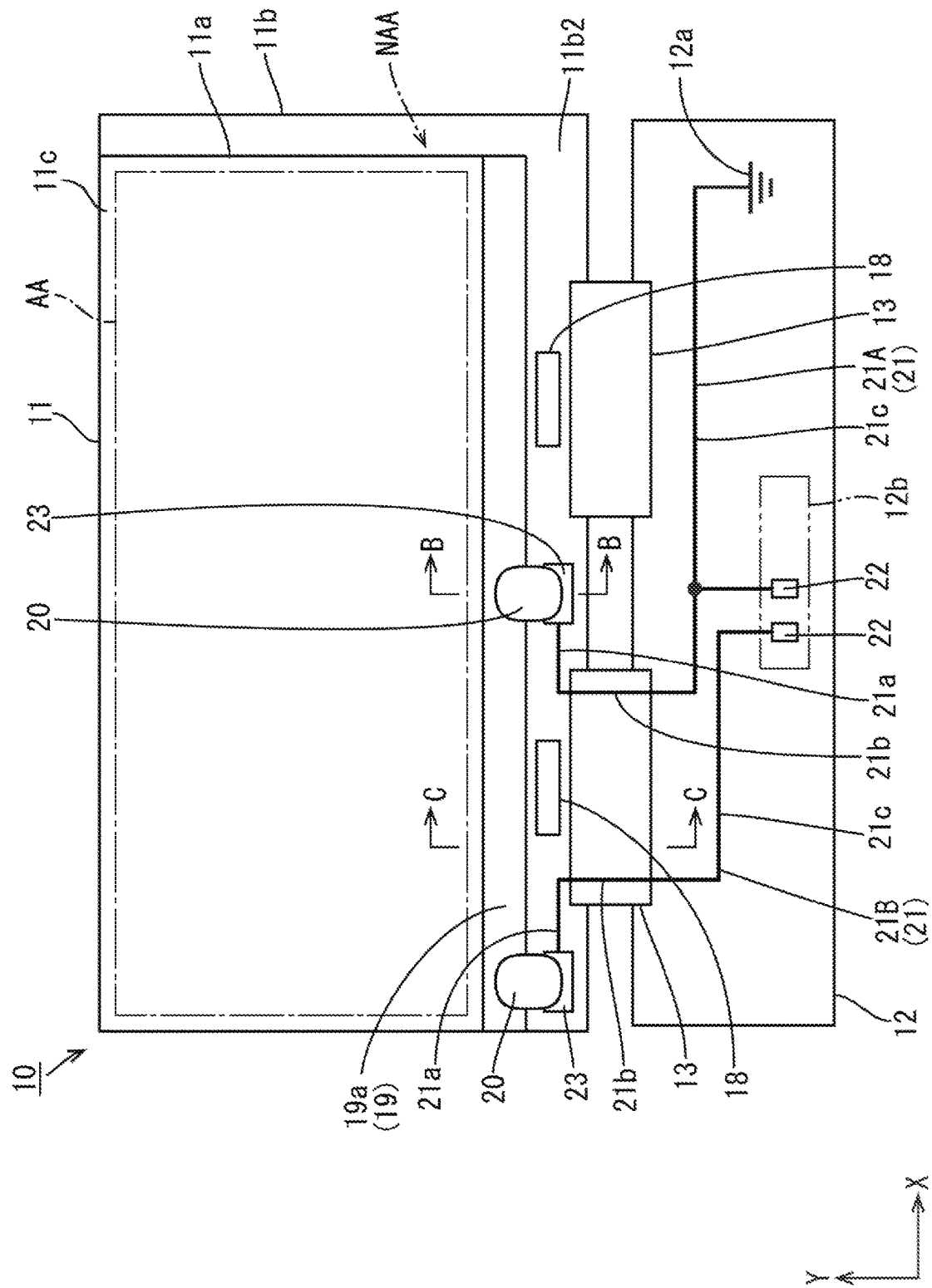
FIG. 1 is a schematic plan view illustrating a connection configuration of a liquid crystal panel, flexible boards, and a control circuit board, which are included in a liquid crystal display device according to a first embodiment of the invention.
Figure 2:
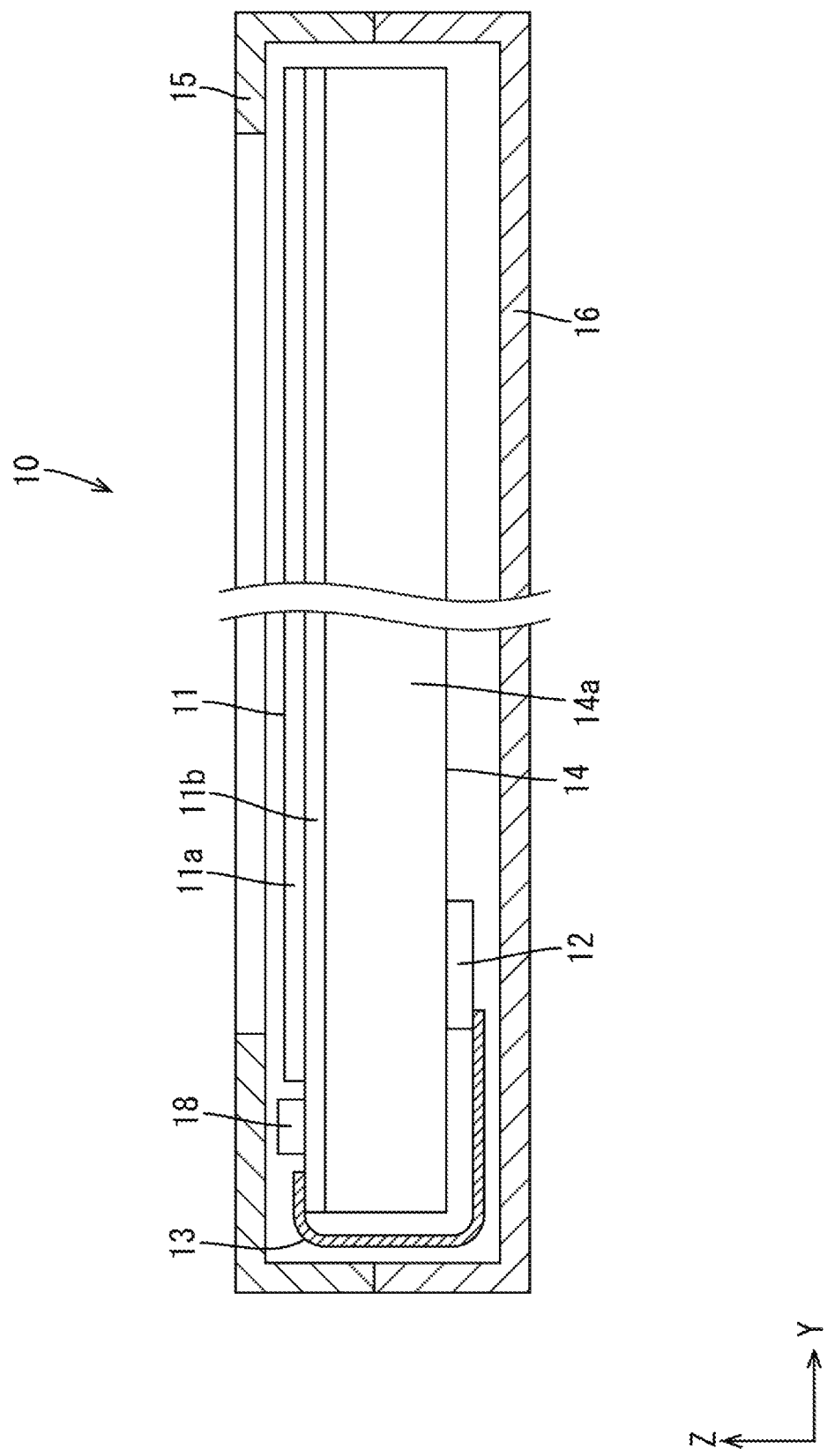
FIG. 2 is a schematic cross-sectional view illustrating a cross-sectional configuration taken in a long-side direction of the liquid crystal display device.

As illustrated in FIGS. 1 and 2, the liquid crystal display device 10 has a horizontally elongated rectangular overall shape and at least includes a liquid crystal panel (display panel) 11 configured to display an image, a control circuit board (panel connection board) 12 configured to supply various input signals to the liquid crystal panel 11 from an external device, a flexible board 13 electrically connecting the liquid crystal panel 11 and the control circuit board 12 to each other, and a backlight unit (lighting unit) 14, which is an external light source configured to apply light to the liquid crystal panel 11. As illustrated in FIG. 2, the liquid crystal display device 10 includes a bezel 15 and a casing 16 to house and hold the liquid crystal panel 11 and the backlight unit 14 attached to each other. The bezel 15 has a frame-like shape and surrounds a display area (active area) AA of the liquid crystal panel 11 on which an image is displayed. The casing 16 has a thin box-like shape having an opening at the front side.

The backlight unit 14 is briefly described first. As illustrated in FIG. 2, the backlight unit 14 at least includes a chassis 14a having a box-like shape having an opening at the front side (side adjacent to the liquid crystal panel 11), a light source (not illustrated) (such as a cold-cathode tube, an LED, and an organic EL) disposed in the chassis 14a, and an optical member (not illustrated) covering the opening of the chassis 14a. The optical member has a function of converting light from the light source into planar light, for example.

The liquid crystal panel 11 is described. The liquid crystal panel 11 has a rectangular overall shape in plan view. As illustrated in FIG. 3f the liquid crystal panel 11 at least includes two substantially transparent glass substrates 11a and 11b having high light transmitting properties and a liquid crystal layer 11e disposed between the substrates 11a and 11b. The liquid crystal layer 11e includes liquid crystal molecules, which are substances whose optical properties are changed by application of an electrical field. The substrates 11a and 11b are bonded together by a sealant (not illustrated) with a gap corresponding to the thickness of the liquid crystal layer 11e therebetween. As illustrated in FIG. 1, the liquid crystal panel 11 has a display area AA, on which an image is displayed, at a substantially center of the screen, and a non-display area (non-active area) NAA, on which an image is not displayed, at an outer periphery of the screen. The non-display area NAA has a frame-like shape (a framework-shape, an annular shape) and surrounds the display area AA. The short side direction of the liquid crystal panel 11 matches the Y-axis direction, the long side direction thereof matches the X-axis direction, and the thickness direction thereof matches the Z-axis direction. In FIG. 1, a frame-shaped area indicated by a one-dot chain line indicates an outer shape of the display area AA that is slightly smaller than the CF substrate 11a, and an area outside the one-dot chain line is the non-display area NAA.

Figure 8:
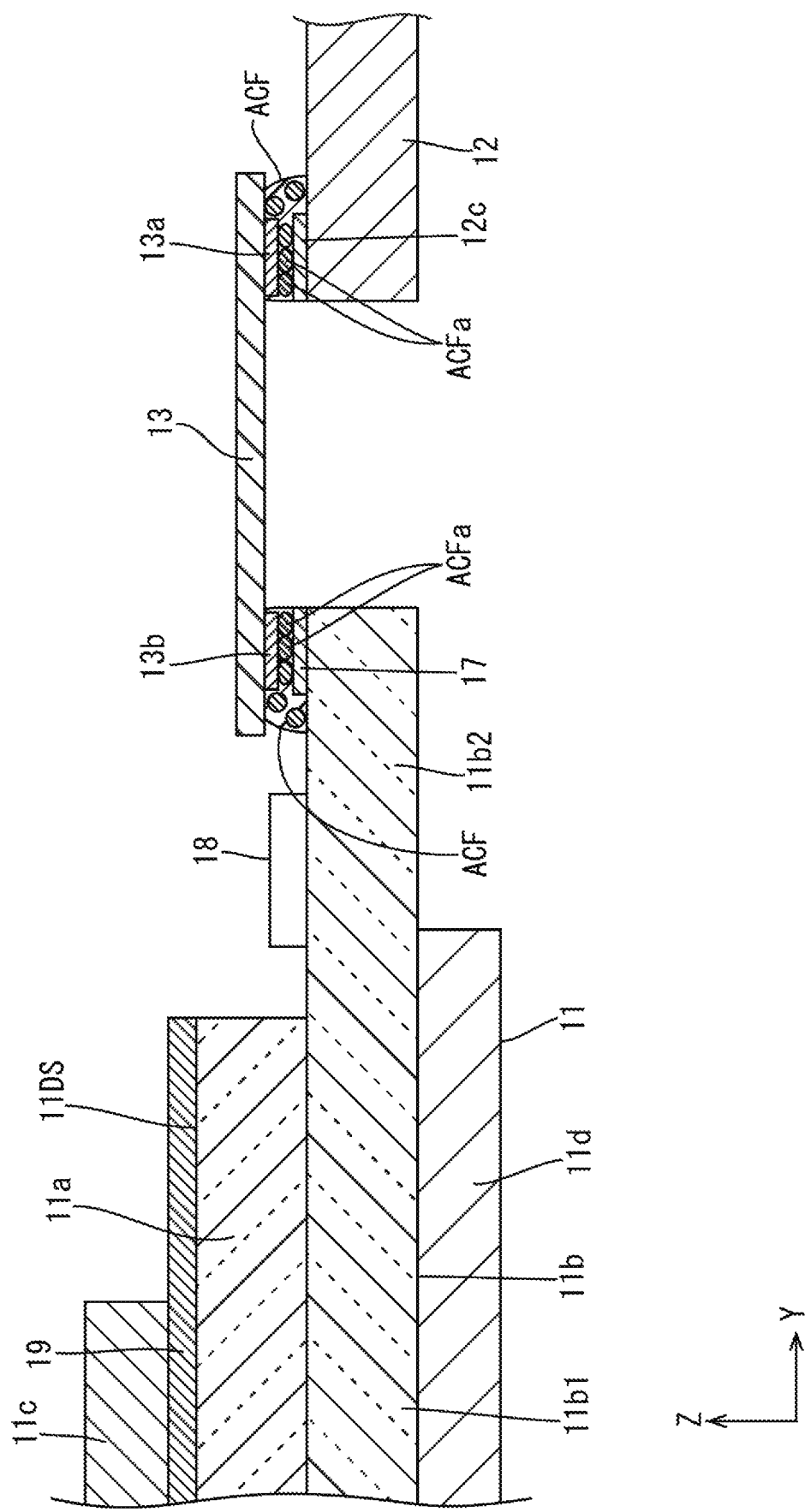
FIG. 8 is a cross-sectional view illustrating the liquid crystal panel, the flexible board, and the control circuit board taken along line C-C in FIG. 1.

In the liquid crystal panel 11, the substrate 11a on the front side (front surface side) is a CF substrate (a first substrate, a counter substrate) 11a and the substrate 11b on the rear side (rear surface side) is an array substrate (a second substrate, an active matrix substrate, a device substrate) 11b. As illustrated in FIG. 1, the CF substrate 11a has smaller short sides and smaller long sides than the array substrate 11b. The CF substrate 11a is bonded to the array substrate 11b with an end portion along one of the long sides and an end portion along one of the short sides being aligned with those of the array substrate 11b (an upper end portion and a left end portion in FIG. 1). Thus, the CF substrate 11a does not overlap the array substrate 11b over a predetermined area including end portions along the other of the short sides (a lower end portion and a right end portion in FIG. 1), allowing front and rear planar surfaces of the end portions to be exposed to the outside. The exposed area is used as a mounting area of the flexible board 13 and a driver 18. The array substrate 11b has a CF substrate overlapping portion (a counter substrate overlapping portion) 11b1 that overlaps the CF substrate 11a in plan view and a CF substrate non-overlapping portion (a counter substrate non-overlapping portion) 11b2 that do not overlap the CF substrate 11a in plan view. The CF substrate non-overlapping portion 11b2 is located next to the CF substrate overlapping portion 11b1. A lower end portion of the CF substrate non-overlapping portion 11b2 extending in the X-axis direction in FIG. 1 is used as a mounting area of the flexible board 13 and the driver 18. As illustrated in FIG. 8, a panel-side terminal 17, which is electrically connected to the flexible board 13, and a driver terminal (not illustrated), which is electrically connected to the driver 18, are disposed on the mounting area. The panel-side terminal 17 and the driver terminal are formed of a metal film or a transparent electrode film formed by a photolithography method on the array substrate 11b. The driver 18 is configured to be activated by a signal supplied from the control circuit board 12 to control driving of the liquid crystal panel 11. The driver 18 is mounted on the CF substrate non-overlapping portion 11b2 of the array substrate 11b by using chip on glass (COG) technology. The driver 18 is constituted of on LSI chip having a drive circuit therein. The driver 18 generates output signals by processing input signals supplied from the control circuit board 12 and outputs the output signals to the display area AA of the liquid crystal panel 11.

Figure 3:
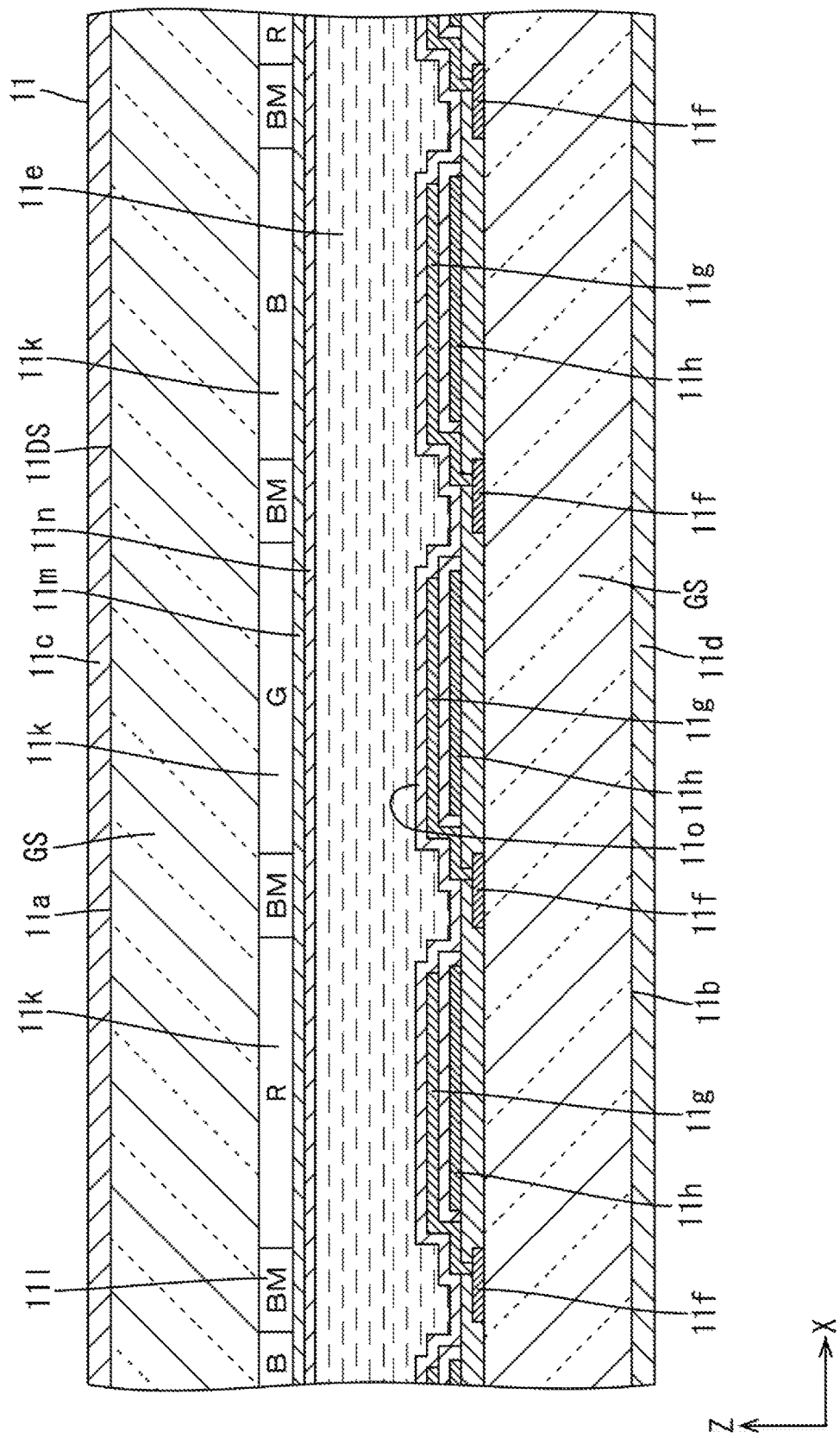
FIG. 3 is a schematic cross-sectional view illustrating a cross-sectional configuration of a display area of the liquid crystal panel.

As illustrated in FIGS. 2 and 3, the front outer surface of the CF substrate 11a (the surface away from the array substrate 11b) of the substrates 11a and 11b is a display surface 11DS of the liquid crystal panel 11 on which an image is displayed. As illustrated in FIG. 3, polarizing plates 11c and 11d are respectively attached to outer surfaces of the substrates 11a and 11b. The polarizing plates 11c and 11d each have a horizontally elongated rectangular shape in plan view as the substrates 11a and 11b. The polarizing plates 11c and 11d have long sides substantially equal to long sides of the substrates 11a and 11b and short sides shorter than short sides of the substrates 11a and 11b. As illustrated in FIG. 1, the upper end portions of the polarizing plates 11a and 11b in the short side direction (end portions located away from the flexible boards 13) are aligned with the upper end portions of the substrates 11a and 11b. In this configuration, the lower end portions of the substrates 11a and 11b illustrated in FIG. 1 (end portions located adjacent to the flexible boards 13) ore not covered by the polarizing plates 11c and 11d and exposed to the outside.

Figure 4:
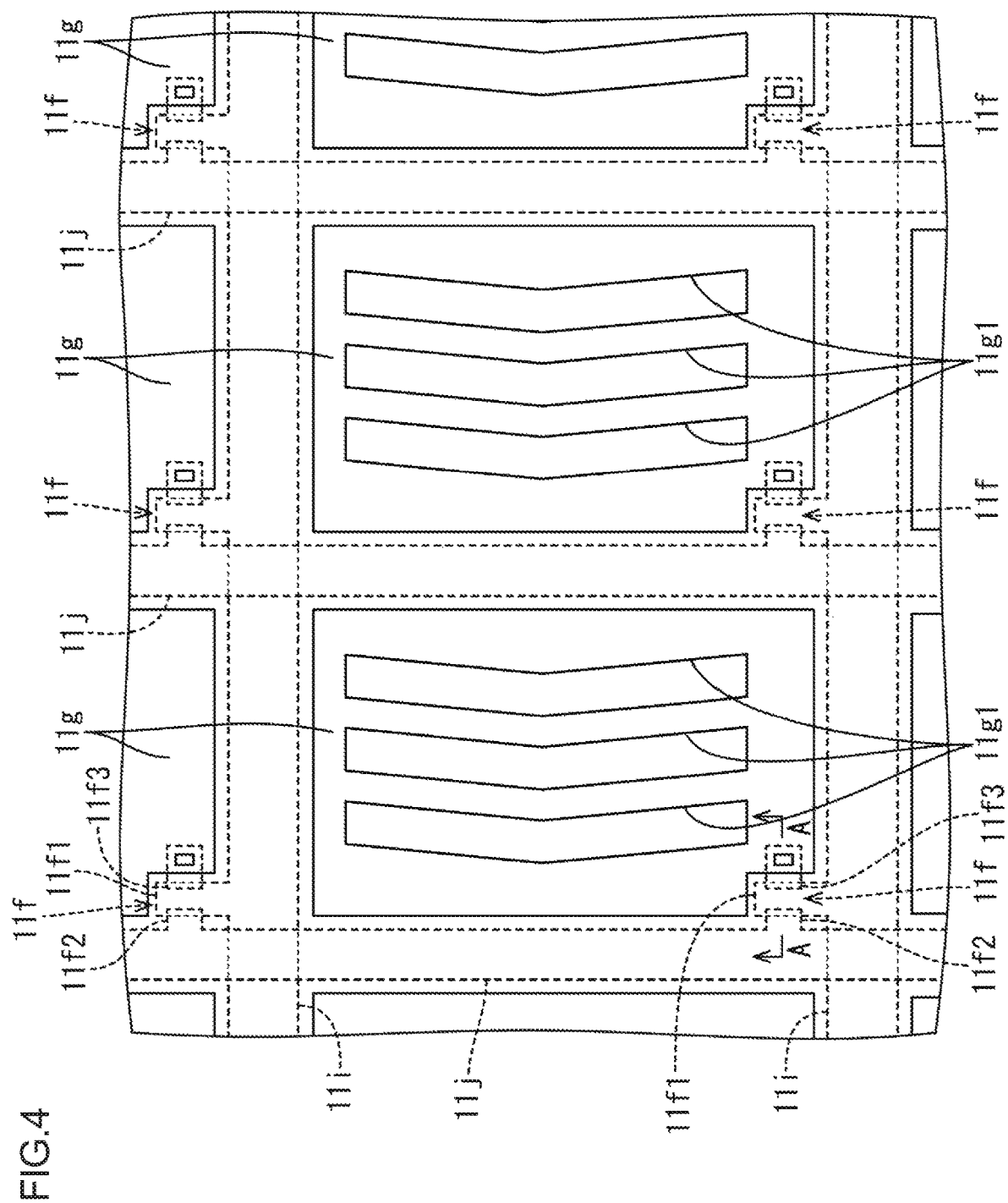
FIG. 4 is a plan view schematically illustrating a wiring configuration in the display area of an array substrate, which is included in the liquid crystal panel.

As illustrated in FIGS. 3 and 4, multiple TFTs (thin film transistors, display elements) 11f, which are switching elements, and multiple pixel selectors 11g are arranged in a matrix (rows and columns) in the display area AA of an inner surface of the array substrate 11b (a surface adjacent to the CF substrate 11a). Gate lines (scanning lines) 11i and source lines (data lines, signal lines) 11j are routed in a grid form to surround the TFTs 11f and the pixel electrodes 11g. The gate lines Hi and the source lines 11j are respectively connected to gate electrodes 11f1 and source electrodes 11f2 of the TFTs 11f, and the pixel electrodes 11g are connected to drain electrodes 11f3 of the TFTs 11f. The TFTs 11f are driven in response to the signals supplied to the gate lines 11i and the source lines 11j. Supply of potential to the pixel electrodes 11g is controlled based on the driving. As illustrated in FIGS. 4 and 6, the TFTs 11f each include a channel portion 11f4 connecting the drain electrode 11f3 and the source electrode 11f2 to each other. An oxide semiconductor material is used as a semiconductor film that forms the channel portion 11f4. The oxide semiconductor material forming the channel portion 11f4 has electron mobility higher than that of amorphous silicon material, for example, about 20 times to about 50 times higher than that of amorphous silicon material. Thus, the TFTs 11f are able to be readily downsized and an amount of light transmitting through the pixel electrodes 11g (aperture ratio of the display pixel) is able to be maximized. The oxide semiconductor material is preferably employed to provide higher resolution and to reduce power consumption. The gate electrode 11f1 and the gate line 11i are formed of the same metal film. A gate insulating film 11p is disposed between the gate electrode 11f1 and the channel portion 11f4 (a semiconductor film). In this embodiment, the extending direction of the gate lines 11i matches the X-axis direction, and the extending direction of the source lines 11j match the Y-axis direction in the drawings.

As illustrated in FIG. A, the pixel electrodes 11g are disposed in respective rectangular areas defined by the gate lines 11i and the source lines 11j and are formed of transparent electrode films made of indium tin oxide (ITO) or zinc oxide (ZnO). The source electrode 11f2 and the drain electrode 11f3 are formed of the same metal film as the source line 11j. As illustrated in FIG. 6, a first interlayer insulating film 11q and a planarizing film 11r are disposed between the pixel electrode 11g and a layer of the source electrode 11f2 and the drain electrode 11f3. The first interlayer insulating film 11q and the planarizing film 11r have a contact hole CH that allows the pixel electrode 11g to be connected to the drain electrode 11f3. Furthermore, a common electrode 11h formed of the same transparent electrode film as the pixel electrode 11g is disposed on the inner side of the array substrate 11b. The common electrode 11h as an upper layer sandwiches a second interlayer insulating film 11s with the pixel electrode 11g. The common electrode 11h is in a substantially solid pattern. As illustrated in FIG. 4, the pixel electrode 11g has parallel slits 11g1. A horizontal electric field is generated between the end of the slit 11g1 in the pixel electrode 11g and the common electrode 11h in accordance with the voltage applied to the pixel electrode 11g. The liquid crystal layer 11e contains horizontally-aligned liquid crystal molecules. In other words, the liquid crystal panel 11 according to the embodiment is an IPS (In-Plane Switching) liquid crystal panel. The above-described horizontal electric field is controlled in accordance with the voltage applied to the pixel electrode 11g to control the alignment of the liquid crystal molecules contained in the liquid crystal layer 11e.

Figure 5:
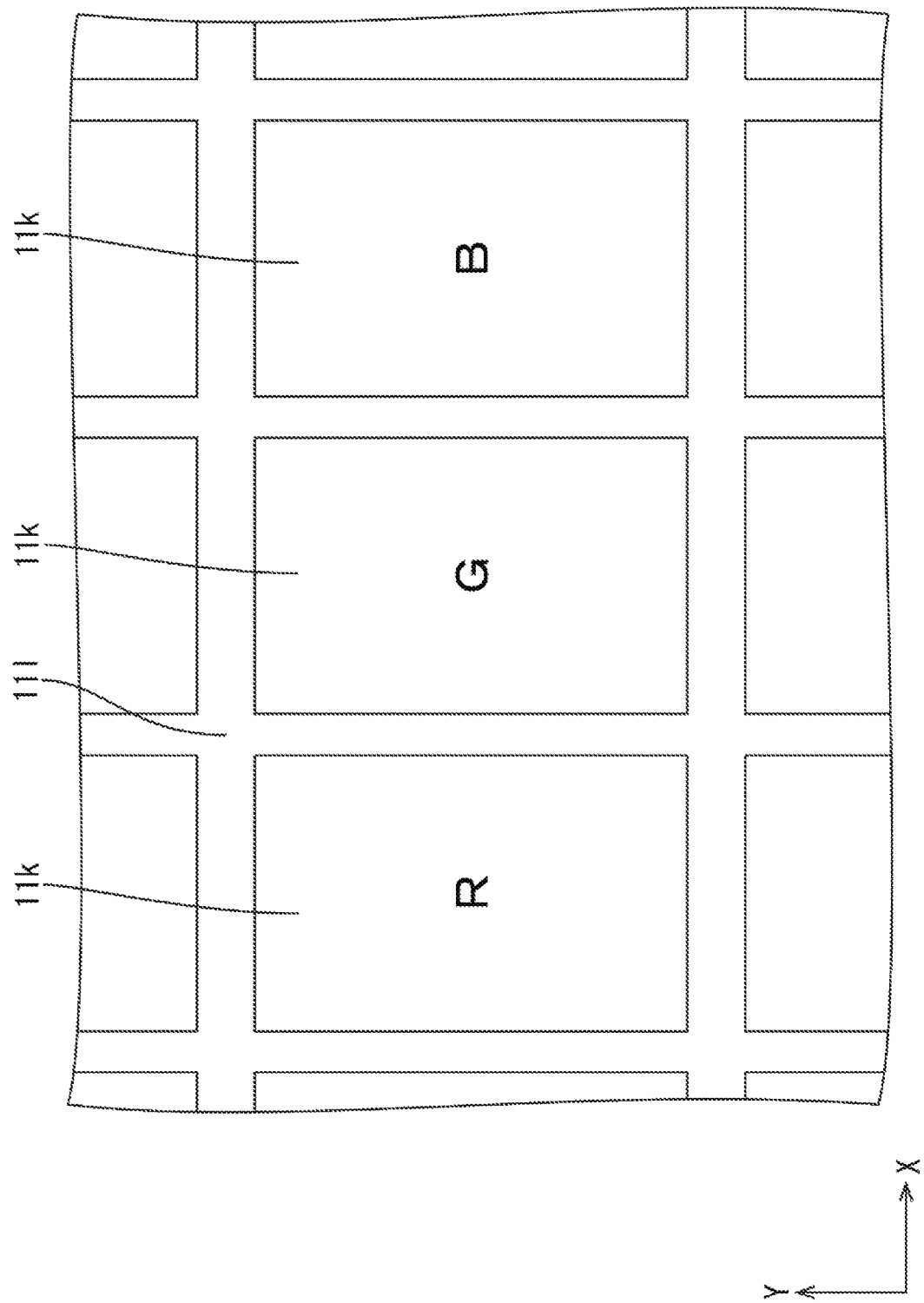
FIG. 5 is a magnified plan view illustrating a plan configuration of the display area of a CF substrate, which is included in the liquid crystal panel.

As illustrated in FIGS. 3 and 5, multiple color filters 11k are arranged in a matrix on an inner surface of the CF substrate 11a (a surface adjacent to the array substrate 11b, a surface away from the display surface 11DS) in the display area AA so as to face the pixel electrodes 11g adjacent to the array substrate 11b. The color filters 11k include R (red), G (green), and B (blue) color films arranged repeatedly in a predetermined order. A light blocking film (a black matrix) 11l is disposed between the color filters 11k to prevent mixture of colors. The light blocking films 11l overlap the gate lines 11i and the source lines 11j in plan view. An overcoat film 11m is disposed on the surfaces of the color filters 11k and the light blocking films 11l. Alignment films 11n and 11o for alignment of liquid crystal molecules contained in the liquid crystal layer 11e are respectively disposed on the inner side of the substrates 11a and 11b. In the liquid crystal panel 11, R, G, and B color films of the color filters 11k and three pixel electrodes 11g facing the respective color filters 11k form one display pixel, which is a display unit. The display pixel includes a red pixel including the R color filter 11k, a green pixel including the G color filter 11k, and a blue pixel including the B color filter 11k. The display pixels of each color are repeatedly arranged in the row direction (the X-axis direction) on the surface of the liquid crystal panel 11 to form a display pixel group. Many display pixel groups are arranged in the column direction (the Y-axis direction).

Next, components connected to the liquid crystal panel 11 is described. As illustrated in FIG. 2, the control circuit board 12 is attached to a rear surface (an outer surface away from the liquid crystal panel 11) of the chassis 14a of the backlight unit 14 with a fastener such as a taping member and a hook. The control circuit board 12 includes a paper phenolic substrate or a glass epoxy resin substrate on which an electric component configured to supply various input signals to the liquid crystal panel 11 is disposed and wiring lines (conductive paths) in a predetermined pattern (not illustrated) is routed. As illustrated in FIG. 1, the control circuit board 12 includes a ground 12a connected to the ground and kept at a ground potential. One of the above-described wiring lines is connected to the ground 12a. Furthermore, the control circuit board 12 includes a connector 12b to which an external connector (not illustrated) is externally connected. In FIG. 1, a formation area of the connector 12b is indicated by a two-dot chain line. The flexible board 13, which is described later, is connected to the control circuit board 12 at one end (a first end). As illustrated in FIG. 8, the control circuit board 12 has a control circuit board side terminal 12c connected to the end of the wiring line. The control circuit board side terminal 12c is connected to the flexible board 13.

As illustrated in FIGS. 1 and 2, the flexible board 13 includes a base formed of an insulating and flexible synthetic resin material (polyimide resin, for example) and wiring pattern having multiple wiring lines (not illustrated) on the base. Two flexible boards 13 are disposed on the liquid crystal panel 11 with a predetermined space therebetween in the long side direction (X-axis direction). The flexible board 13 is connected to the control circuit board 12, which is located on the rear surface of the chassis 14a as described above, at one end extending in the length direction and is connected to the CF substrate non-overlapping portion 11b2 of the array substrate 11b, which is included in the liquid crystal panel 11, at the other end extending in the length direction. Since the flexible board 13 having flexibility has high flexibility in shape, the flexible board 13 in the liquid crystal display device 10 is bent to have a substantially U-like cross-sectional shape in accordance with the above-described connection configuration. This configuration enables the control circuit board 12 to be positioned as above, enabling the control circuit board 12 to be positioned with a high degree of freedom.

As illustrated in FIG. 8, the flexible board 13 is electrically and mechanically connected to the control circuit board 12 and the array substrate 11b, which are connection targets, with an anisotropic conductive film ACF therebetween. A first flexible board side terminal 13a and a second flexible board side terminal 13b that are connected to ends of the wiring pattern are disposed at ends of the flexible board 13 extending in the length direction of the flexible board 13. The first flexible board side terminal 13a is in conductive contact with the control circuit board side terminal 12c of the control circuit board 12 with conductive particles ACFa of the anisotropic conductive film ACF therebetween. The second flexible board side terminal 13b is in conductive contact with the panel side terminal 17 on the array substrate 11b with conductive particles ACFa of the anisotropic conductive film ACF therebetween.

Here, aa described above, the liquid crystal panel 11 according to the embodiment operates in an IPS mode, which is one type of horizontal electric field modes. The pixel electrodes 11g and the common electrodes 11h, which are configured to apply an electric field to the liquid crystal layer 11e, are located adjacent to the array substrate 11b, not the CF substrate 11a. In this configuration, the CF substrate 11a is less likely to have charges accumulated on the display surface 11DS, which is an outer surface, compared with the array substrate 11b. The accumulated charges may generate a vertical electric field and disorder the alignment of the liquid crystal layer 11e, leading to a display defect. To solve the problem, as illustrated in FIGS. 1 and 7, a conductive layer 19 is disposed on the outer surface of the CF substrate 11a, i.e., the display surface 11DS. The conductive layer 19 is electrically connected to the ground 12a of the control circuit board 12 through the flexible board 13, for example. This configuration allows the charges accumulated on the display surface 11DS of the CF substrate 11a to escape to the ground 12a. Thus, the charges are less likely to be accumulated on the display surface 11DS and the alignment in the liquid crystal layer 11e is less likely to be disordered, leading to a reduction in the display defect. The conductive layer 19 is formed of a transparent electrode film formed in a solid form over substantially the entire area of the display surface 11DS of the CF substrate 11a. The transparent electrode film forming the conductive layer 19 is made of a transparent electrode material, such as indium tin oxide (ITO) and zinc oxide (ZrO). The transparent electrode material is preferably the same transparent electrode material as that forms the pixel electrodes 11g or the common electrodes 11h on the array substrate 11b but may be a different transparent electrode material. The conductive layer 19 is largely covered by the polarizing plate 11c attached to the display surface 11DS of the CF substrate 11a, but an end portion (a lower end portion in FIG. 1) that is located adjacent to the flexible board 13 in the Y-axis direction and extends in the X-axis direction is not covered by the polarizing plate 11c and is exposed to the outside. An exposed portion 19a of the conductive layer 19 substantially corresponds to the exposed portion of the display surface 11DS of the CF substrate 11a and has a strip-like shape having a substantially constant width.

As illustrated in FIG. 1, the conductive layer 19 is electrically connected to the ground 12a through the conductive member 20, which extends from the display surface 11DS of the CF substrate 11a to the front surface (inner surface) (adjacent to the CF substrate 11a) of the array substrate 11b, and the connection wiring line 21 routed through this array substrate 11b, the flexible board 13, and the control circuit board 12. Two conductive members 20 and two connection wiring lines 21 are provided and each one of them is electrically connected to the ground 12a. Two inspection terminals (terminals) 22 connected to the respective second ends of the connection wiring lines 21 are disposed on the control circuit board 12. The inspection terminals 22, which are described in detail later, are used to determine if the conductive layer 19 is properly connected to the ground 12a through the conductive member 20 and the connection wiring line 21. The two inspection terminals 22 are disposed on the connector 12b of the control circuit board 12 and configured to be electrically connected to an external connector (not illustrated externally connected to the connector 12b.

The conductive member 20 is formed of a conductive paste such as a silver paste. As illustrated in FIG. 7, the conductive member 20 is connected to the exposed portion 19a of the conductive layer 19 on the display surface 11DS of the CF substrate 11a at the first end and to a ground pad portion 23 on the array substrate 11b at the second end. There is a difference in level substantially equal to the thickness of the CF substrate 11a between the conductive layer 19, which is located on the display surface 11DS of the CF substrate 11a, and the ground pad portion 23, which is located on the inner surface (surface adjacent to the CF substrate 11a) of the array substrate 11b (the CF substrate non-overlapping portion 11b2). The conductive member 20 formed of a conductive paste having high formation flexibility in shape is able to readily stretch from the ground pad portion 23 to the conductive layer 19 with high connection reliability in spite of the difference in level. As illustrated in FIG. 1, two conductive members 20 are arranged in the X-axis direction with a space substantially corresponding to the width of the flexible board 13 therebetween. One of the conductive members 20 is located adjacent to one end (left end in FIG. 1) of the liquid crystal panel 11 in the X-axis direction and the other of the conductive members 20 is located at a substantially center of the liquid crystal panel 11 in the X-axis direction. The flexible board 13 is located between the conductive members 20 in the X-axis direction. This reduces the possibility that the conductive members 20 will be short-circuited by the wiring line on the array substrate 11b, for example. The conductive members 20 are unlikely to prevent connection between the array substrate 11b and the flexible board 13. The ground pad portion 23 is formed of a metal film or a transparent electrode film formed on the array substrate 11b by photolithography method as the panel side terminal 17.

As illustrated in FIG. 1, the number of the connection wiring lines 21 and the number of the conductive members 20 are the same, i.e., two. One of the connection wiring lines 21 is a first connection wiring line 21A connected to one of the conductive members 20 (located at the center in the X-axis direction) at the first end. The first connection wiring line 21A branches into two at the second end. One of the branches is connected to the inspection terminal 22 and the other of the branches is connected to the ground 12a. The other of the connection wiring lines 21 is a second connection wiring line 21B connected to the conductive member 20 (located adjacent to the end in the X-axis direction) at the first end and connected to the other of the inspection terminals 22 at the second end. The second connection wiring line 21B is not directly connected to the ground 12a. Hereinafter, when the connection wiring lines 21 need to be distinguished from each other, one connected to the ground 12a is referred to as the "first connection wiring line" with the suffix A attached to the reference numeral and one not connected to the ground 12a is referred to as the "second connection wiring line" with the suffix B attached to the reference numeral. When the connection wiring lines 21 do not need to be distinguished and are collectively described, no suffix is attached to the reference numeral.

As illustrated in FIG. 1, the connection wiring lines 21 each include a first wiring portion 21a on the array substrate 11b, a second wiring portion 21b on the flexible board 13, and a third wiring portion 21c on the control circuit board 12. The first wiring portion 21a on the array substrate 11b is connected to the ground pad portion 23 at the first end and to the panel side terminal 17 at the second end. The first wiring portion 21a is formed of a metal film or a transparent electrode film formed by photolithography method on the array substrate 11b as the ground pad portion 23 and the panel side terminal 17. The second wiring portion 21b on the flexible board 13 is connected to the second flexible board side terminal 13b at the end adjacent to the liquid crystal panel 11 and to the first flexible board terminal 13a at the end adjacent to the control circuit board 12. The third wiring portion 21c on the control circuit board 12 is connected to the control circuit board side terminal 12c at the first end and connected to the inspection terminal 22 and the ground 12a at the second ends. Specifically described, the third wiring portion 21c of the first connection wiring line 21A branches into two. One of the branches is connected to the inspection terminal 22 and the other of the branches is connected to the ground 12a. The third wiring portion 21c of the second connection wiring line 21B is connected to only the inspection terminal 22 at the second end.

The embodiment has the above-described configuration and the operation thereof is described next. In the production of the liquid crystal display device 10, the conductive members 20 are applied to the liquid crystal panel 11 that has been produced by a predetermined process. The applied conductive members 20 are connected to the conductive layer 19 on the display surface 11DS of the CF substrate 11a of the liquid crystal panel 11 and the ground pad portion 23 on the inner surface of the array substrate 11b. One end of the flexible board 13 is connected to the liquid crystal panel 11 having the conductive members 20 thereon and the other end of the flexible board 13 is connected to the control circuit board 12. Thus, the first wiring portion 21a, the second wiring portion 21b, and the third wiring portion 21c, which are included in the connection wiring line 21, are connected to each other. Then, the backlight unit 14 is attached to the liquid crystal panel 11, and the bezel 15 and the casing 16 are subsequently attached thereto.

Figure 9:
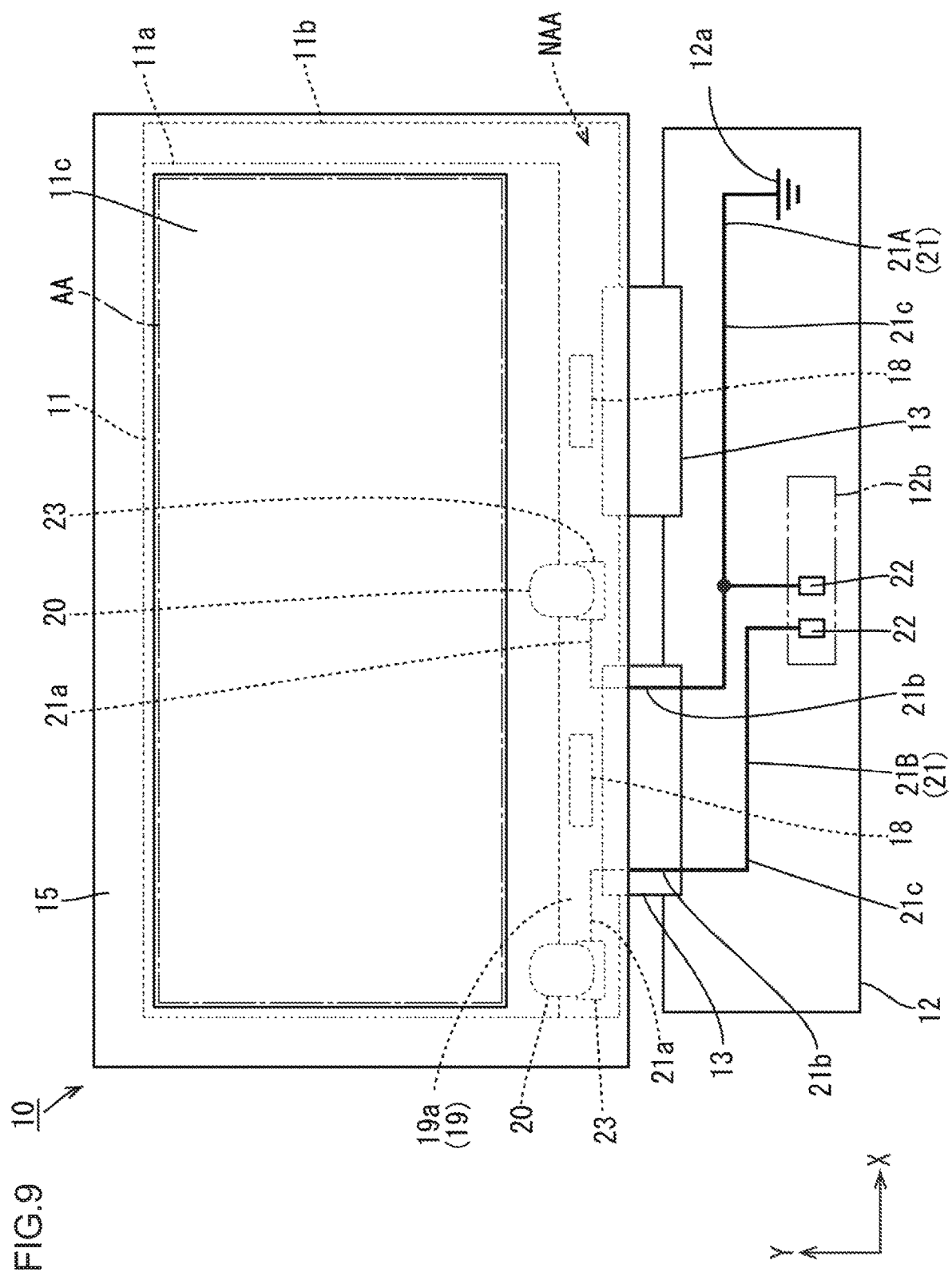
FIG. 9 is a schematic plan view illustrating the liquid crystal panel having a bezel on the front surface.

Here, as illustrated in FIG. 9 in which the bezel 15 is attached to the liquid crystal panel 11 from the front side, the bezel 15 covers the exposed portion 19a of the conductive layer 19. In this state, it is difficult to make direct contact with the conductive layer 19, and the measurement of the resistance between the conductive layer 19 and the ground 12a may be impossible. To overcome the problem, in this embodiment, the two inspection terminals 22 are disposed on the connector 12b of the control circuit board 12. The measurement of the resistance between the two inspection terminals 22 enables determination on whether the conductive layer 19 is properly connected to the ground 12a through the conductive member 20 and the connection wiring line 21, although the bezel 15 covers the conductive layer 19. An external connector connected to an inspection device (not illustrated) is fitted to the connector 12b to measure the resistance. Specifically described, one of the inspection terminals 22 is connected to the conductive layer 19 through the first connection wiring line 21A and the conductive member 20 connected to the first connection wiring line 21A and the other of the inspection terminals 22 is connected to the conductive layer 19 through the second connection wiring line 21B and the conductive member 20 connected to the second wiring line 21B. The resistance between the inspection terminals 22 measured by an inspection device is lower than a reference value when the connections are good. However, the resistance between the inspection terminals 22 measured by an inspection device is higher than the reference value when there is a bad connection at any one of the connections. The resistance between the inspection terminals 22 exceeding the reference value reveals that the conductive layer 19 is not properly connected to the ground 12a. With this configuration, the timing flexibility of the inspection is high. After the inspection, while the external connector is detached from the connector 12b, at least the first connection wiring line 21A is connected to the ground 12a such that the charges on the conductive layer 19 escape to the ground 12a.

As described above, the liquid crystal display device (display device) 10 of the embodiment includes the liquid crystal panel (display panel) 11 configured to display an image. The display panel 11 includes the CF substrate (first substrate) 11a having the display surface 11DS and the array substrate (second substrate) 11b disposed over the surface of the CF substrate 11a opposite the display surface 11DS. The display panel 11 further includes the control circuit board (panel connection board) 12 connected to the array substrate 11b, the conductive layer 19 on the display surface 11DS of the CF substrate 11a, the conductive members 20 each extending from the display surface 11DS of the CF substrate 11a to the surface of the array substrate 11b adjacent to the CF substrate 11a and each having the first end connected to the conductive layer 19, the connection wiring lines 21 extending from the array substrate 11b to the control connection board 12 and having the first ends connected to the respective second ends of the conductive members 20, the ground 12a disposed on the control circuit board 12 and connected to the second end of at least one of the connection wiring lines 21, and the inspection terminals (terminals) 22 disposed on the control circuit board 12 and connected to the second ends of the plurality of connection wiring lines 21.

In this configuration, the conductive members 20, which extend from the display surface 11DS of the CF substrate 11a to the surface of the array substrate 11b adjacent to the CF substrate 11a, are connected to the conductive layer 19 on the display surface 11DS of the CF substrate 11a at the first ends and connected to the connection wiring lines 21, which extend from the array substrate 11b to the control circuit board 12, at the second ends. Since at least one of the connection wiring lines 21 is connected to the ground 12a at the second end, the charges on the display surface 11DS of the CF substrate 11a are able to escape to the ground 12a. Thus, charges are less likely to be accumulated on the display surface 11DS. A resistance between the conductive layer 19 and the ground 12a may be measured to check if the conductive layer 19 is properly connected to the ground 12a through the conductive member 20 and the connection wiring line 21. However, the conductive layer 19 is covered by a component in some cases depending on the production process. In such a case, direct contact with the conductive layer 19 is impossible, making it difficult to measure the resistance. To overcome the problem, the control circuit board 12 has the inspection terminals 22 connected to the second ends of the connection wiring lines 21. This configuration enables the above-described inspection, when the direct contact with the conductive layer 19 is impossible, by measurement of the resistance between the inspection terminals 22. This improves the timing flexibility of the inspection.

Furthermore, the liquid crystal display device 10 includes the flexible board 13 having flexibility and connecting the array substrate 11b and the control circuit board 12 to each other. Since the flexible board 13 having flexibility has high flexibility in shape, the control circuit board 12 connected to the flexible board 13 is positioned with a high degree of freedom. This configuration facilitates the inspection by using the inspection terminals 22 on the control circuit board 12.

The conductive members 20 are positioned with the flexible board 13 connected to the array substrate 11b therebetween. With this configuration, the conductive members 20 are unlikely to prevent the connection between the array substrate 11b and the flexible board 13.

One of the connection wiring lines 21 is routed on a different one of the flexible boards 13. With this configuration, the connection wiring lines 21 are able to be routed on different flexible boards 13 in accordance with the positioning of the conductive members 20 on the array substrate 11b, for example. This enables optimization of the wiring route of the connection wiring lines 21 and reduces the length of the wiring lines.

The liquid crystal display device 10 includes the liquid crystal layer 11e between the CF substrate 11a and the array substrate 11b. With this configuration, charges are less likely to be accumulated on the display surface 11DS of the CF substrate 11a, leading to less alignment disorder of the liquid crystal molecules in the liquid crystal layer 11e, which is located between the CF substrate 11a and the array substrate 11b. Thus, high display quality is stably obtained.

Second Embodiment

A second embodiment of the invention is described with reference to FIG. 10. In the second embodiment, the number of conductive members 120, the number of connection wiring lines 121, and the number of inspection terminals 122 are changed. Configurations, operations, and effects similar to those in the first embodiment are not described.

Figure 10:
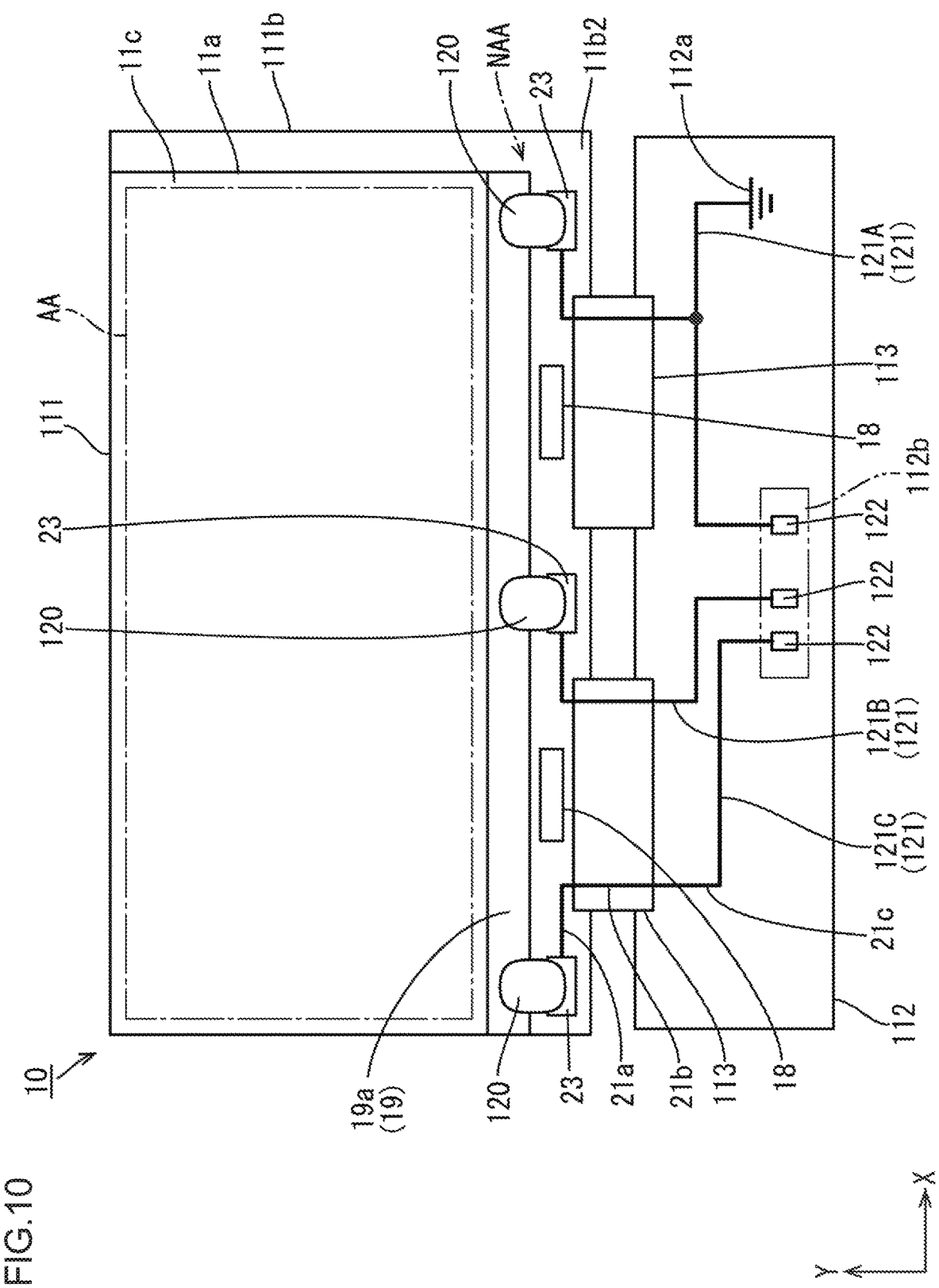
FIG. 10 is a schematic plan view illustrating a connection configuration between a liquid crystal panel, flexible boards, and a control circuit board, which are included in a liquid crystal display device according to a second embodiment of the invention.

As illustrated in FIG. 10, in this embodiment, the number of the conductive members 120, the number of the connection wiring lines 121, and the number of the inspection terminals 122 are each three, which is larger than the number of the flexible boards 113 by one. Two of the three conductive members 120 are positioned adjacent to the respective ends in the X-axis direction of the liquid crystal panel 111 and one of them is positioned at a substantially center in the X-axis direction of the liquid crystal panel 111. Each space between adjacent two of the conductive members 120 is substantially equal to the width of the flexible board 113. The left flexible board 113 in FIG. 10 is located between two of the conductive members 120 located adjacent to the left end and the center of the liquid crystal panel 111 in the X-axis direction and the right flexible board 113 in FIG. 10 is located between two of the conductive members 120 located adjacent to the right end and the center of the liquid crystal panel 111 in the X-axis direction.

Three connection wiring lines 121 are routed on the two flexible boards 113. Specifically described, two of the connection wiring lines 121 are routed on the left flexible board 113 in FIG. 10 and the remaining one of the connection wiring lines 121 is routed on the right flexible board 113 in FIG. 10. The connection wiring line 121 routed on the right flexible board 113 in FIG. 10 is a first connection wiring line 121A connected to both the ground 112a and the inspection terminal 122. The connection wiring lines 121 rotted on the left flexible board 113 in FIG. 10 are a second connection wiring line 121B and a third connection wiring line 121C each connected to only the inspection terminal 122 and not connected to the ground 112a. Hereinafter, when the connection wiring lines 121 need to be distinguished from each other, the connection wiring lines 121 not connected to the ground 112a are referred to as the "second connection wiring line" and the "third connection wiring line" with the suffixes B and C attached to the reference numerals. When the connection wiring lines 121 do not need to be distinguished and are collectively described, no suffix is attached to the reference numerals. The three inspection terminals 122 connected to the respective connection wiring lines 121 are disposed on the connector 112b with a space therebetween in the X-axis direction.

In the inspection, the resistance between the inspection terminal 122 connected to the first connection wiring line 121A and the inspection terminal 122 connected to the second connection wiring line 121B is treasured and the resistance between the inspection terminal 122 connected to the second connection wiring line 121B and the inspection terminal 122 connected to the third connection wiring line 121C is measured. The resistance exceeding the reference value reveals existence of a bad connection and reveals which one of the routes has the bad connection.

As described above, in this embodiment, the flexible boards 113 are disposed with a space therebetween and connected to the array substrate 111b and the control circuit board 112. The number of the conductive members 120, the number of the connection wiring lines 121, and the number of the inspection terminals 122 are each larger than the number of the flexible boards 113 by one. In this configuration, the flexible boards 113 are disposed in the respective spaces between the conductive members 120, which outnumber the flexible boards 113 by one. The resistances between the inspection terminals 122, which are connected to the conductive members 120 through the connection wiring lines 121, are measured for the inspection.

Third Embodiment

A third embodiment according to the invention is described with reference to FIG. 11. In the third embodiment, the number of the flexible boards 213, the number of conductive members 220, the number of the connection wiring lines 221, and the number of the inspection terminals 222 are different from those in the second embodiment. Configurations, operations, and effects similar to those in the second embodiment are not described.

Figure 11:
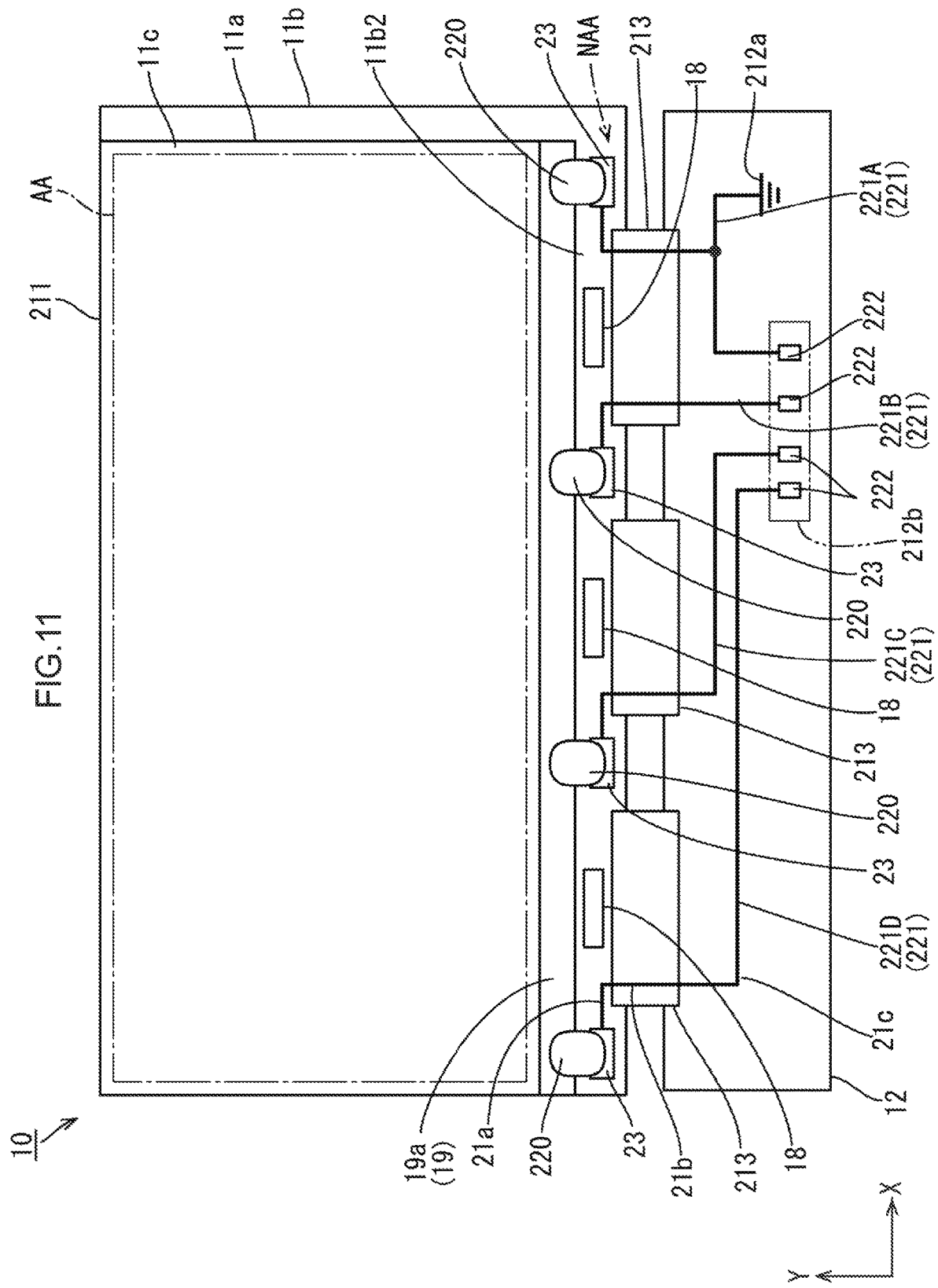
FIG. 11 is a schematic plan view illustrating a connection configuration between a liquid crystal panel, flexible boards, and a control circuit board, which are included in a liquid crystal display device according to a third embodiment of the invention.

As illustrated in FIG. 11, in a liquid crystal panel 211 according to the embodiment, a ratio of a long side to a short side is larger than that in the first and second embodiments. In this embodiment, the number of the flexible boards 213 is three, and the number of the conductive members 220, the number of the connection wiring lines 221, and the number of inspection terminals 222 are each four, which is larger than the number of the flexible boards 213 by one.

The three flexible boards 213 are disposed with a substantially equal space therebetween in the X-axis direction. The four conductive members 220 are each disposed with a space substantially corresponding to the width of the flexible board 213 in the X-axis direction. The flexible boards 213 are disposed in the respective spaces between the conductive members 220. The four connection wiring lines 221 include a first connection wiring line 221A connected to both the ground 212a and the inspection terminal 222, and second, third, and fourth connection wiring lines 221B, 221C, and 221D each connected to only the inspection terminal 222 and not connected to the ground 212a. Hereinafter, when the connection wiring lines 221 need to be distinguished from each other, the connection wiring lines 221 not connected to the ground 212a are referred to as the "second connection wiring line", the "third connection wiring line", and the "fourth connection wiring line" with the suffixes B, C, and D attached to the respective reference numerals, when the connection wiring lines 221 do not need to be distinguished and are collectively described, no suffix is attached to the reference numerals. The first and second connection wiring lines 221A and 221B are routed on the same flexible board 213. The third and fourth connection wiring lines 221C and 221D are routed on different flexible boards 213.

In the inspection, the resistance between the inspection terminal 222 connected to the first connection wiring line 221A and the inspection terminal 222 connected to the second connection wiring line 221B is measured, the resistance between the inspection terminal 222 connected to the second connection wiring line 221B and the inspection terminal 222 connected to the third connection wiring line 221C is measured, and the resistance between the inspection terminal 222 connected to the third connection wiring line 221C and the inspection terminal 222 connected to the fourth connection wiring line 221D is measured. The resistance exceeding the reference value reveals existence of a bad connection and reveals which one of the routes has the bad connection.

Fourth Embodiment

A fourth embodiment according to the invention is described with reference to FIG. 12 or FIG. 13. In the fourth embodiment, an inspection method of a liquid crystal display device 310 is different from that in the first embodiment. Configurations, operations, and effects similar to those in the first embodiment are not described.

Figure 12:
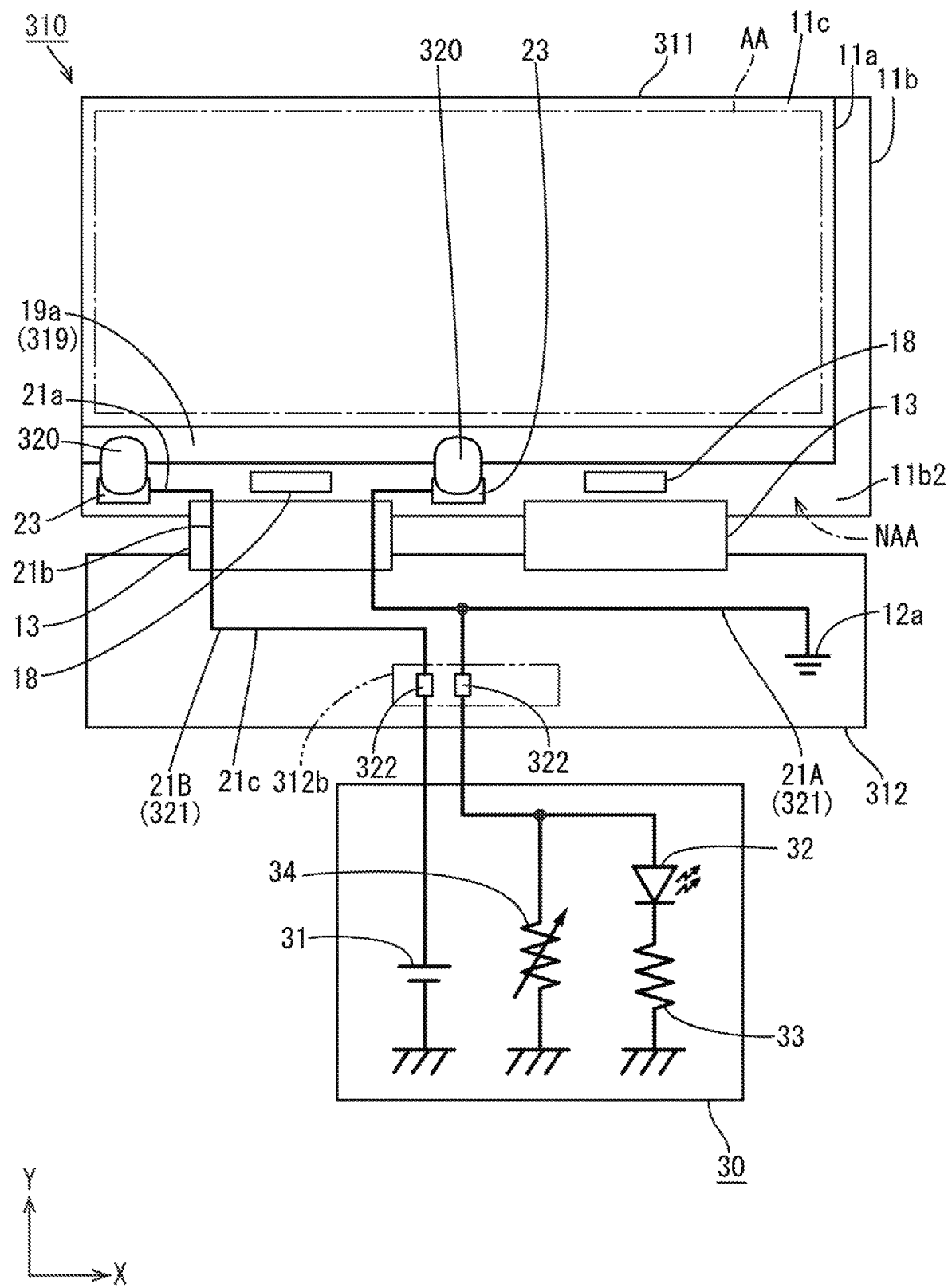
FIG. 12 is a schematic plan view illustrating a connection configuration between a liquid crystal panel, flexible boards, a control circuit board, and an inspection device, which are included in a liquid crystal display device according to a fourth embodiment of the invention.
Figure 13:
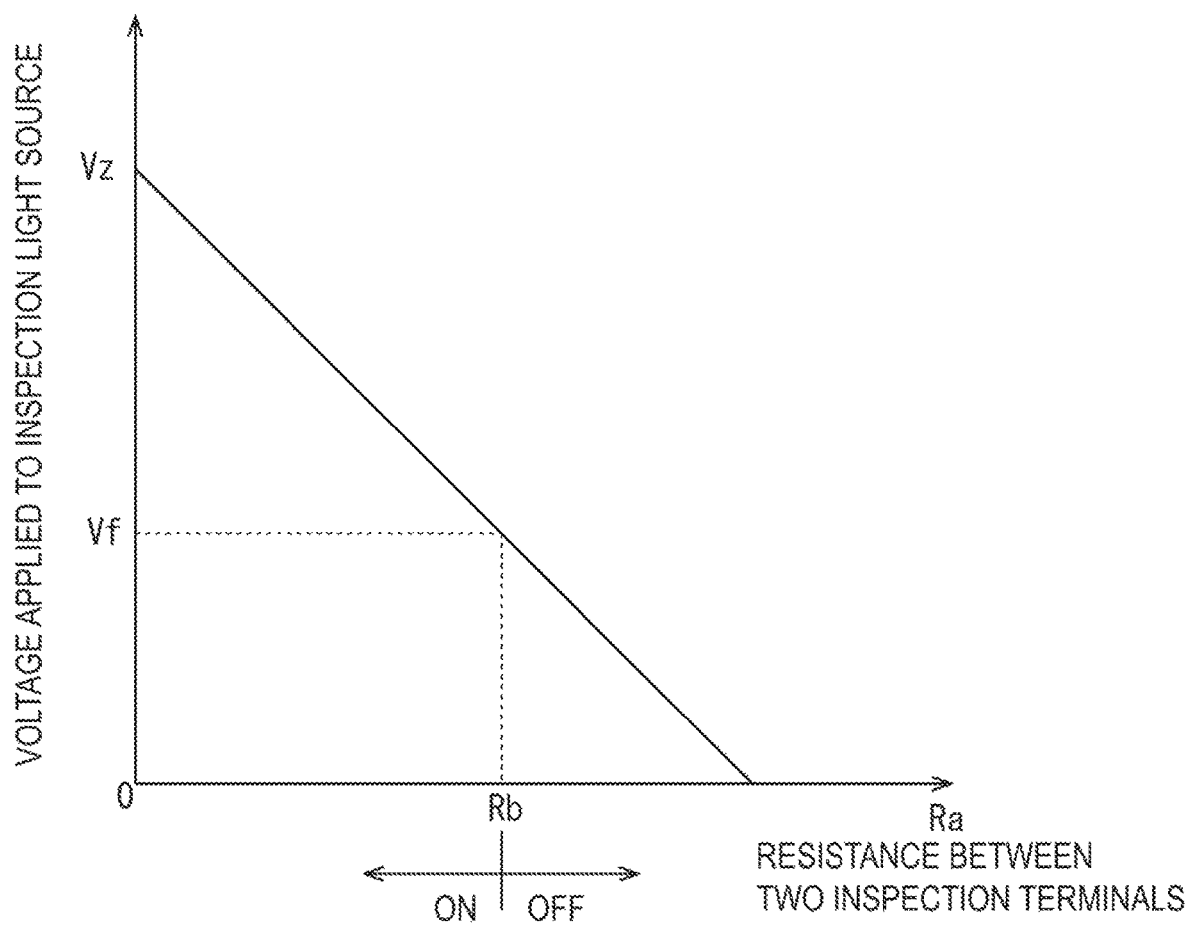
FIG. 13 is a graph indicating relationship between a resistance between two inspection terminals and a voltage applied to an inspection light source.

The inspection method of the liquid crystal display device 310 according to this embodiment uses an inspection device 30 illustrated in FIG. 12. As illustrated in FIG. 12, the inspection device 30 includes an inspection source 31 connected to one of the inspection terminals 322, an inspection light source 32 connected to the other of the inspection terminals 322, a protection resistor 33 connected in series to the inspection light source 32, and a variable resistor 34 connected in parallel with the inspection light source 32. The inspection device 30 has an external connector (not illustrated) connected to the connector 312b of the control circuit board 312. The external connector has an inspection device side terminal connected to the inspection source 31 and an inspection device side terminal connected to the inspection light source 32, the protection resistor 33, and the variable resistor 34. The inspection device side terminals are in conductive contact with the inspection terminals 322. The inspection source 31 is configured to apply a predetermined direct current (about 5V, for example. The inspection light source 32 is a light emitting diode (LED), for example, and is configured to be switched on upon receiving a voltage equal to or larger than a predetermined threshold voltage Vf. The protection resistor 33 is configured to prevent an excessive current from flowing into the inspection light source 32 to prevent damage to the light emitting element. The variable resistor 34 is configured to suitably adjust the resistance Rs.

In the above-described inspection device 30, the voltage Vz applied to the inspection light source 32 changes with the resistance Ra between two of the inspection terminals 322. The relationship is specifically indicated in FIG. 13. The resistance Ra between two of the inspection terminals 322 tends to be lower if there is no bad connection at the connections between the conductive members 320 and the connection wiring lines 321 and tends to be higher if there is a bad connection at any one of the connections. As can be seen from FIG. 13, the voltage Vz applied to the inspection light source 32 decreases at a constant change rate (with linearity) as the resistance Ra between two of the inspection terminals 322 increases. Conversely, the voltage Vz increases at a constant change rate as the resistance Ra decreases. There is an inverse relationship between the resistance Ra and the voltage Vz. A value of the resistance Ra between two of the inspection terminals 322 at which the voltage Vz applied to the inspection light source 32 is a threshold voltage Vf is used as a reference value Rb. The reference value Rb is used for determination of existence of a bad connection at the connections between the conductive members 320 and the connection wiring lines 321.

The relationship between the resistance Ra between two of the inspection terminals 322 and the voltage Vz applied to the inspection light source 32 changes depending on a resistance (variable resistance) Rs of the variable resistor 34. The reference value Rb of the resistance Ra at which the voltage Vz applied to the inspection light source 32 is the threshold voltage Vf increases as the resistance Rs increases. Conversely, the reference value Rb of the resistance Ra decreases as the resistance Rs decreases. Thus, the reference value Rb of the resistance Ra between the inspection terminals 322 is changed by adjustment of the resistance Rs of the variable resistor 34. This enables the inspection device 30 to be used to inspect a liquid crystal display device 310 including a liquid crystal panel 311 having a different screen size. Thus, this configuration is preferable because of its convenience and its cost-saving effect.

Specifically described, in the inspection, an external connector connected to the inspection device 30 is fitted to the connector 312b of the control circuit board 312 to allow the inspection device side terminals to be in conductive contact with the inspection terminals 322. In this state, the inspection source 31 is turned on to apply a predetermined voltage Vz to the inspection light source 32. If the voltage Vz applied to the inspection light source 32 is equal to or greater than the threshold voltage Vf, the inspection light source 32 is switched on. If the voltage Vz does not reach the threshold voltage vf, the inspection light source 32 is not switched on and remains off. The resistance Ra between two of the inspection terminals 322 is equal to or smaller than the reference value Kb when the voltage Vz applied to the inspection light source 32 is equal to or larger than the threshold voltage Vf. Thus, it is determined that there is no bad connection at the connections between the conductive members 320 and the connection wiring lines 321 when the inspection light source 32 is switched on. In contrast, the resistance Ra between two of the inspection terminals 322 exceeds the reference value Rb when the voltage Vz applied to the inspection light source 32 is smaller than the threshold voltage vf. Thus, it is determined that there is a bad connection at any one of the connections between the conductive members 320 and the connection wiring lines 321 when the inspection light source 32 is not switched on. As described above, the existence of the bad connection is readily checked by checking if the inspection light source 32 is switched on or not.

As described above, the inspection method of the liquid crystal display device 310 according to the embodiment is a method of inspecting the liquid crystal display device 310 described in the first embodiment. The method includes connecting the inspection source 31 to any one of the inspection terminals 322, connecting the inspection light source 32 to another one of the inspection terminals 322, and applying a voltage to the inspection source 31 to determine if a resistance between the inspection terminal 322 connected to the inspection source 31 and the inspection terminal 322 connected to the inspection light source 32 exceeds a reference value. The inspection light source 32 is configured to be switched on when a voltage equal to or larger than a threshold voltage is applied thereto. The voltage applied to the inspection light source 32 is smaller than the threshold voltage when the resistance exceeds the reference value. The voltage applied to the inspection light source 32 is equal to or larger than the threshold voltage when the resistance is equal to or smaller than the reference value. In the inspection method of the liquid crystal display device 310, the inspection light source 32 that has not been switched on reveals that there is a bad connection at any one of the connections between the conductive layer 319. The conductive members 320, and the connection wiring lines 321. This facilitates the inspection.

Furthermore, the variable resistor 34 is connected in parallel with the inspection light source 32. The resistance of the variable resistor 34 is adjusted to change the reference value of the resistance, with this configuration, the reference value of the resistance between the inspection terminals 322 connected to the inspection source 31 and the inspection light source 32 is able to be changed by adjustment of the resistance of the variable resistor 34. This enables the inspection proper for the reference value of the resistance, which is likely to change depending on the conditions such as a screen size of the liquid crystal panel 311.

Other Embodiments

The present invention is not limited to the embodiments described above and illustrated by the drawings. For example, the following embodiments will be included in the technical scope of the present invention.

(1) In the above-described embodiments, the first connection wiring line of the connection wiring lines is connected to the ground such that the charges on the conductive layer escape to the ground. However, a connector having a circuit for short-circuiting the inspection terminals therein may be connected to the connector of the control circuit board to electrically connect the connection wiring lines to the ground through the connector.

(2) In the above-described embodiments, only the first connection wiring line of the connection wiring lines is connected to both the ground and the inspection terminal. However, multiple grounds may be disposed on the control circuit board and the connection wiring lines may be connected to the respective grounds.

(3) As a modification of the first and fourth embodiments, the connection wiring lines may be routed on different flexible boards, for example.

(4) As a modification of the first and fourth embodiments, the conductive members may be located adjacent to the ends of the liquid crystal panel, for example.

(5) As a modification of the second and third embodiments, all the connection wiring lines may be routed on the same flexible board, for example.

(6) The specific positions and the specific number, for example, of the conductive members, the connection wiring lines, the inspection terminals, and the other components may be suitably changed from those in the above-described embodiments.

(7) in the above-described embodiments, two or three flexible boards ore disposed on the liquid crystal panel. However one or four or more flexible boards may be disposed on the liquid crystal panel. Furthermore, some of the flexible boards may have different widths. The flexible boards having different widths may be disposed on the liquid crystal panel.

(8) In the above-described embodiments, the conductive layer on the display surface of the CF substrate is formed of a transparent electrode material. However, the material of the conductive layer may be any material having light transmitting properties and conductivity, such as a conductive resin material.

(9) In the above-described fourth embodiment, the inspection light source included in the inspection device is an LED. However, the inspection light source may be any type of light source other than the LED, such as an organic EL. Other than the inspection light source, the specific circuit configuration relating to the inspection device may also be suitably changed.

(10) In the above-described embodiments, the liquid crystal panel including a liquid crystal panel operating in an IPS mode is described as an example. However, the present invention is applicable to a liquid crystal display device including a liquid crystal panel operating in a fringe field switching (FFS) mode as a liquid crystal panel including the pixel electrodes and the common electrodes on the array substrate.

(11) In the above-described embodiments, the driver is mounted on the array substrate by using COG technology. However, the driver may be disposed on the flexible board by using chip on film (COF) technology.

(12) In the above-described embodiments, the liquid crystal display device includes a liquid crystal panel having an oblong planar shape. However, the invention is applicable to a liquid crystal display device including a liquid crystal panel having a square, circular, or elliptical planar shape, for example.

(13) In the above-described embodiments, the semiconductor film that forms the channel portion of the TFT is made of the oxide semiconductor material. However, the material of the semiconductor film may be polysilicon (continuous grain silicon (CG silicon), which is one kind of silicon in polycrystalline form (polycrystalline silicon)), or amorphous silicon.

(14) in the above-described embodiments, the color filters in the liquid crystal panel ore in three colors of red, green, and blue. However, the invention is applicable to the color filters in four colors. In addition to the red, green, and blue color portions, a yellow color portion may be added.

(15) In the above-described embodiments, the liquid crystal panel includes the liquid crystal layer between two substrates. However, the present invention is applicable to a display panel including functional organic molecules other than the liquid crystal material between two substrates.

(16) In the above-described embodiments, the TFTs are used as the switching elements of the liquid crystal panel. However, the invention is applicable to a liquid crystal panel including switching elements other than the TFTs (e.g., thin film diodes (TFDs)). The invention is also applicable to a black-and-white liquid crystal panel other than the color liquid crystal panel.

(17) In the above-described embodiments, the liquid crystal panel is used as a display panel. However, the invention is applicable to other types of display panels, such as a plasma display panel (PDP), an organic EL panel, an electrophoretic display panel (EPD), and a micro electro mechanical system (MEMS) display panel.

(18) Configurations other than those in the above-described embodiments may be employed. For example, the casing may be eliminated and the components such as a substrate on the rear of the backlight unit may be exposed.

EXPLANATION OF SYMBOLS 10, 310 . . . liquid crystal display device (display device), 11, 111, 211, 311 . . . liquid crystal panel (display panel), 11a . . . CF substrate (first substrate), 11b, 111b . . . array substrate (second substrate), 11e . . . liquid crystal layer, 11DS . . . display surface, 12, 112, 312 . . . control circuit board (panel connection board), 12a, 112a, 212a . . . ground, 13, 113, 213 . . . flexible board, 19, 319 . . . conductive layer, 20, 120, 220, 320 . . . conductive member, 21, 121, 221, 321 . . . connection wiring line, 22, 122, 222, 322 . . . inspection terminal (terminal), 31 . . . inspection source, 32 . . . inspection light source, 34 . . . variable resistor

The invention claimed is:
1. A display device comprising:
a display panel configured to display an image, the display panel including a first substrate having a display surface and a second substrate disposed over a surface of the first substrate opposite the display surface;
a panel connection board connected to the second substrate;
a plurality of inspection terminals disposed on the panel connection board and configured to be connectable to an inspection device outside the panel connection board;
a ground disposed on the panel connection board and to which at least one of the plurality of inspection terminals is electrically connected;

a plurality of ground pads disposed on the second substrate and electrically connected to the plurality of inspection terminals, respectively;
a conductive layer on the display surface of the first substrate;
a plurality of conductive members including first ends fixed to the conductive layer and second ends fixed to the plurality of ground pads, respectively; and
a plurality of connection wiring lines including first ends and second ends, the first ends being coupled to the plurality of ground pads, respectively, the second ends being coupled to the plurality of inspection terminals, respectively, at least one of the plurality of connection wiring lines connected to the at least one of the plurality of inspection terminals electrically connected to the ground including one of the second ends including a first branch being coupled to the ground and a second branch being couple to the at least one of the plurality of inspection terminals.

2. The display device according to claim 1, further comprising at least one flexible board having flexibility and connecting the second substrate to the panel connection board, the at least one flexible board including a first end fixed to an edge of the second substrate and a second end fixed to an edge of the panel connection board adjacent to the edge of the second substrate, wherein
the plurality of the conductive members is separated from each other in a direction along the edge of the second substrate, and
the first end of the at least one flexible board is fixed to a section of the edge of the second substrate between the plurality of conductive members.

3. The display device according to claim 2, wherein
the at least one flexible board includes a plurality of flexible boards, the plurality of flexible boards including first ends fixed to the edge of the second substrate and second ends fixed to the edge of the panel connection board adjacent to the edge of the second substrate
the first ends of the plurality of flexible board are fixed to sections of the edge of the second substrate between the plurality of conductive members and
each of a number of the plurality of conductive members, a number of the plurality of connection wiring lines, and a number of the plurality of inspection terminals is larger than a number of the flexible boards by one.

4. The display device according to claim 3, wherein the plurality of connection wiring lines includes sections, some of which are routed on one of the plurality of flexible boards and some of which are routed on another one of the plurality of flexible boards.

5. The display device according to claim 1, further comprising a liquid crystal layer between the first substrate and the second substrate.

6. An inspection method of the display device according to claim 1, comprising:
connecting an inspection source to any one of the plurality of inspection terminals;
connecting an inspection light source to another one of the plurality of inspection terminals, the inspection light source being configured to be switched on when a voltage equal to or larger than a threshold voltage is applied thereto; and
applying a voltage to the inspection source to determine if a resistance between the inspection terminal connected to the inspection source and the inspection terminal connected to the inspection light source exceeds a reference value, wherein the voltage applied to the inspection light source is smaller than the threshold voltage when the resistance exceeds the reference value, and the voltage applied to the inspection light source is equal to or larger than the threshold voltage when the resistance is equal to or smaller than the reference value.

7. The inspection method of the display device according to claim 6, wherein a variable resistor is connected in parallel with the inspection light source, a resistance of the variable resistor is adjusted to change the reference value of the resistance.

8. The display device according to claim 1, wherein
the conductive layer is covered by a polarizing plate such that an end portion of the conductive layer located in an end portion of the first substrate is exposed,
the plurality of conductive members is made of a conductive paste,
the plurality of conductive members stretches from the plurality of ground pads on the second substrate to the end of the conductive layer not covered by the polarizing plate on the first substrate to connect the end portion of the conductive layer to the plurality of grounds pads.

9. The display device according to claim 2, further comprising a driver configured to operate on a signal supplied by the panel connection board to control driving of the display panel, the driver and the at least one flexible board are disposed between the plurality of conductive members.

10. The display device according to claim 1, wherein the panel connection board includes a connector on which the plurality of inspection terminals is disposed and configured to be fitted to a connector of the inspection device.

11. A display device comprising:
a display panel configured to display an image, the display panel including a first substrate having a display surface and a second substrate disposed over a surface of the first substrate opposite the display surface;
a panel connection board connected to the second substrate;
a first inspection terminal disposed on the panel connection board and configured to be connectable to an inspection device outside the panel connection board;
a second inspection terminal disposed on the panel connection board and configured to be connectable to the inspection device;
a ground disposed on the panel connection board and to which the first inspection terminal is electrically connected;
a first ground pad disposed on the second substrate and electrically connected to the first inspection terminal and the ground;
a second ground pad disposed on the second substrate and electrically connected to the second inspection terminal;
a conductive layer on the display surface of the first substrate;
a first conductive member including a first end fixed to the conductive layer and a second end fixed to the first ground pad;
a second conductive member including a first end fixed to the conductive layer and a second end fixed to the second ground pad;
a first connection wiring line including a first end and a second end, the first end of the first connection wiring line being coupled to the first ground pad, the second end of the first connection wiring line including a first branch being coupled to the ground and a second branch being couple to the first inspection terminal; and a second connection wiring line including a first end and a second end, the first end of the second connection wiring line being coupled to the second ground pad, the second end of the second connection wiring line being coupled to the second inspection terminal.

12. The display device according to claim 11, further comprising at least one flexible board having flexibility and connecting the second substrate to the panel connection board, the at least one flexible board including a first end fixed to an edge of the second substrate and a second end fixed to an edge of the panel connection board adjacent to the edge of the second substrate, wherein the first conductive member and the second conductive member are separated from each other in a direction along the edge of the second substrate, and the first end of the flexible board is fixed to a section of the edge of the second substrate between the first conductive member and the second conductive member.

13. The display device according to claim 12, wherein the at least one flexible board includes a plurality of flexible boards, and the first and second connection wiring lines include sections, some of which are routed on one of the plurality of flexible boards and some of which are routed on another one of the plurality of flexible boards.

14. The display device according to claim 11, wherein the conductive layer is covered by a polarizing plate such that an end portion of the conductive layer located in an end portion of the first substrate is exposed, the first conductive member and the second conductive member are made of a conductive paste, the first conductive member and the second conductive member stretch from the respective ground pads on the second substrate to the end of the conductive layer not covered by the polarizing plate on the first substrate to connect the end portion of the conductive layer to the respective ground pads.

15. The display device according to claim 11, further comprising a driver configured to operate on a signal supplied by the panel connection board to control driving of the display panel, the driver being disposed between the first conductive member and the second conductive member.

16. The display device according to claim 11, wherein the panel connection board includes a connector on which the first inspection terminal and the second inspection terminal are disposed and configured to be fitted to a connector of the inspection device.

* * * * *